US007495963B2

(12) United States Patent
Edahiro et al.

(10) Patent No.: US 7,495,963 B2
(45) Date of Patent: Feb. 24, 2009

(54) SEMICONDUCTOR MEMORY DEVICE

(75) Inventors: Toshiaki Edahiro, Yokohama (JP);
Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 11/692,501

(22) Filed: Mar. 28, 2007

(65) Prior Publication Data
US 2007/0236985 A1 Oct. 11, 2007

(30) Foreign Application Priority Data
Apr. 6, 2006 (JP) ............................ 2006-105068

(51) Int. Cl.
*G11C 11/34* (2006.01)
(52) U.S. Cl. .................. 365/185.21; 365/185.2
(58) Field of Classification Search ............ 365/185.21, 365/185.2, 207, 210
See application file for complete search history.

(56) References Cited
U.S. PATENT DOCUMENTS 6,807,101 B2 * 10/2004 Ooishi et al. ........... 365/185.21
6,850,435 B2    2/2005 Tanaka
6,906,951 B2 *  6/2005 Wong .................... 365/185.03

2002/0071313 A1 * 6/2002 Takano et al. .......... 365/185.22
2006/0209593 A1   9/2006 Toda
2006/0239073 A1  10/2006 Toda
2007/0121376 A1 * 5/2007 Toda ...................... 365/185.2
2007/0236985 A1  10/2007 Edahiro et al.

FOREIGN PATENT DOCUMENTS
JP        2005/285161       10/2005

OTHER PUBLICATIONS
U.S. Appl. No. 11/864,089, filed Sep. 28, 2007, Edahiro et al.

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes: first and second cell arrays each having electrically rewritable and non-volatile memory cells arranged, memory cells in the main parts serving as information cells used for storing data, the remaining parts as reference cells used for driving a reference current; three or more bit line pairs disposed in the first and second cell arrays, respectively; a sense amplifier so shared by the bit line pairs as to sequentially detect cell current differences between the information cells and the reference cells coupled to the bit line pairs; and first and second data latches arranged to store write data to be written into the first and second cell arrays, each number of the first and second data latches being equal to that of the bit line pairs, which share the sense amplifier and are simultaneously selected.

20 Claims, 28 Drawing Sheets

I-cell, R-cella BLK

I-cell NAND (R-cella NAND)

R-cellb BLK

R-cellb NAND

FIG. 21

| State | Latch Data | Cell Data | | | | |
|---|---|---|---|---|---|---|
| | | E | A | B | C | |
| IDL | VL | 1 | 1 | 0 | 0 | |
| | VLB | 1 | 0 | 0 | 1 | |
| PRG | VL | 0 | 1 | 0 | 1 | Data change of VL (E, C – Level) |
| | VLB | 1 | 0 | 0 | 1 | |
| A-Level Verify | VL | 0 | RD | 0 | 1 | If inverted data of VLB is "0", Data Keep |
| | VLB | 0 | 1 | 1 | 0 | Invert data of VLB prior to Verify, and restore it after Verify. If VLB = "1", Verify Read |
| C-Level Verify | VL | 0 | RD | 0 | RD | If VL = "0", VOUT = "0" If VLB = "0", Data Keep |
| | VLB | 1 | 0 | 0 | 1 | If VLB = "1", Verify Read |

| Cell threshold | BL Voltage Control (1) (DT=Vdd+Vth) | | BL Voltage Control (2) (DT=Vdd/2+Vth) | |
|---|---|---|---|---|
| | VL | SL | VL | SL |
| $V_{th} < VBL$ | 1 | 1 | 1 | 1 |
| $VBL < V_{th} < PB$ | 1 | 0 | 0 | 0 |
| $PB < V_{th}$ | 0 | 0 | 0 | 0 |

SEMICONDUCTOR MEMORY DEVICE

CROSS-REFERENCE TO RELATED APPLICATION

This application is based on and claims the benefit of priority from the prior Japanese Patent Application No. 2006-105068, filed on Apr. 6, 2006, the entire contents of which are incorporated herein by reference.

BACKGROUND OF THE INVENTION

1. Field of the Invention

This invention relates to a semiconductor memory device, and more specifically relates to an electrically rewritable and non-volatile semiconductor memory device (EEPROM).

2. Description of the Related Art

NAND-type flash memory is known as one of EEPROMs. There is increased a demand for NAND-type flash memories in accordance with increasing of the demand for mobile devices, which deal with large capacitive data such as a still or moving image. Being formed of NAND strings (NAND cell units), each of which has multiple memory cells connected in series, a NAND-type flash memory has such features that the unit cell area is small; and it is easy to make the capacity large. While, there is such a drawback that the NAND-type flash memory is not suitable for a high-speed random access-use because the cell current is small.

In consideration of this, the data transmission rate is made high in such a way that data are read out to a page buffer, and then serially output, thereby resulting in that NAND-type flash memory is made adaptable to a high-speed system via a buffer DRAM and the like.

A sense amplifier usually used in the NAND-type flash memory is a voltage detecting type one, which precharges a bit line, and then detects the bit line voltage after discharging it with a cell current for a certain time (for example, refer to JP-A-2004-118940).

By contrast, there has already been provided a differential sense amplifier of a current sensing type, which is possible to sense a small cell current at a high rate (for example, refer to JP-A-2005-285161). By use of this sensing scheme, in which a pair of bit lines becomes differential inputs, it is also possible to avoid interferences due to capacitances between bit lines.

SUMMARY OF THE INVENTION

According to an aspect of the present invention, there is provided a semiconductor device including:

first and second cell arrays each having electrically rewritable and non-volatile memory cells arranged, memory cells in the main parts of the first and second cell arrays serving as information cells used for storing data, the remaining parts thereof serving as reference cells used for driving a reference current used for sensing data of the information cells;

three or more bit line pairs disposed in the first and second cell arrays, each pair being constituted by first and second bit lines disposed in the first and second cell arrays, respectively;

a sense amplifier so shared by the bit line pairs as to sequentially detect cell current differences between the information cells and the reference cells coupled to the bit line pairs; and first and second data latches arranged to store write data to be written into the first and second cell arrays, each number of the first and second data latches being equal to that of the bit line pairs, which share the sense amplifier and are simultaneously selected.

According to another aspect of the present invention, there is provided a semiconductor memory device including:

first and second cell arrays each having electrically rewritable and non-volatile memory cells arranged, memory cells in the main parts of the first and second cell arrays serving as information cells used for storing data, the remaining parts thereof serving as reference cells used for driving a reference current used for sensing data of the information cells;

three or more bit line pairs disposed in the first and second cell arrays, each pair being constituted by first and second bit lines disposed in the first and second cell arrays, respectively;

a sense amplifier so shared by the bit line pairs as to sequentially detect cell current differences between the information cells and the reference cells coupled to the bit line pairs;

first and second data latches arranged to store write data to be written into the first and second cell arrays, each number of the first and second data latches being equal to that of the bit line pairs, which share the sense amplifier and are simultaneously selected; and first and second data transfer nodes disposed in correspondence with first and second output nodes of the sense amplifier, respectively, wherein in a data read mode, cell current differences generated between the bit line pairs simultaneously selected in the first and second cell arrays are sequentially transferred to and detected by the sense amplifier, the sensed output of which are sequentially transferred to one of the first and second data latches serving as data caches via one of the first and second data transfer node, and in a data write mode, write data loaded in one of the first and second data latches are used for controlling bit line voltage for simultaneously selected bit lines in one of the first and second cell arrays.

BRIEF DESCRIPTION OF THE DRAWINGS

FIG. 21 shows the data transition state of data latches VL and VLB in the upper page write mode.

DETAILED DESCRIPTION OF THE EMBODIMENTS

First, in this invention, arranged in a cell array are "information cells" for storing data and "reference cells" with the same structure as the information cells for generating reference currents used for judging cell data. Written in a reference cell is a reference level, which is necessary for detecting the information cell data. When one information cell is coupled to one input of the sense amplifier, one reference cell is coupled to the other input of a sense amplifier.

Second, the sense amplifier is formed as a current sensing type one, which detects a current difference between an information cell and a reference cell to sense cell data at a high rate. To detect surely a small cell current, it is required of the sense amplifier to have sufficiently small the threshold voltage variations and gate length variation of transistors. Therefore, it is not easy to make the occupied area of the sense amplifier small.

Third, in consideration of the above described situation, it is used such a scheme that three or more bit line pairs share a sense amplifier, and simultaneously selected bit line pairs are exchanged sequentially coupled to the sense amplifier. Preferably, the number, N, of bit line pairs sharing a sense amplifier is set as: $N=2^m (m>2)$ for the sake of data processing. In the embodiment described later, 16 bit line pairs are disposed to share a sense amplifier, and 8 bit line pairs therein are simultaneously selected.

Fourth, to store write data to be written simultaneously in multiple bit lines, first and second data latch groups are disposed corresponding to first and second cell arrays, from which first and second bit line constituting a pair are selected, on condition that each data latch group contains the same number of data latches as the bit line pairs simultaneously selected.

Illustrative embodiments of this invention will be explained with reference to the accompanying drawings below.

[Memory Chip Configuration]

Figure 1:
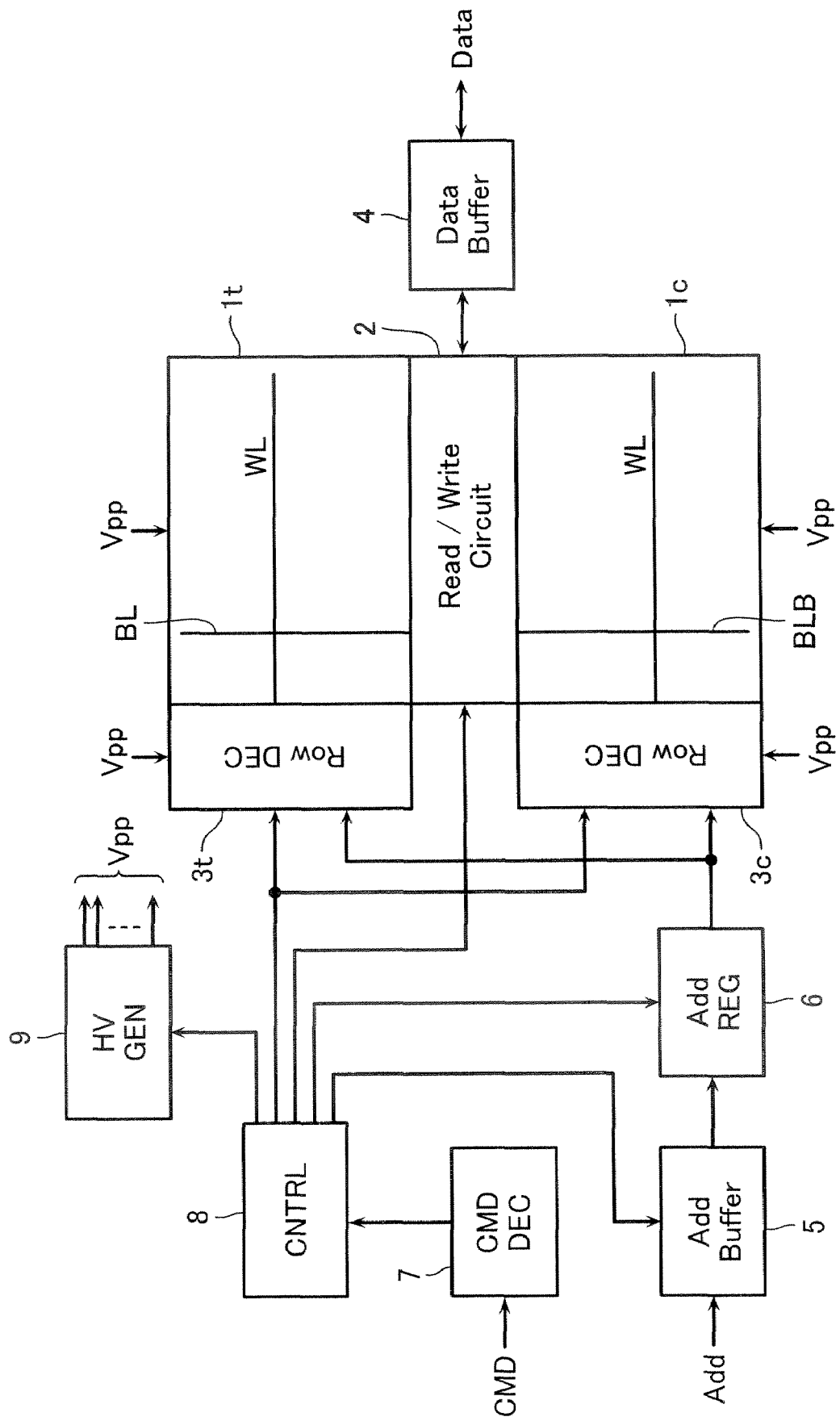
FIG. 1 shows a functional block configuration of a flash memory in accordance with an embodiment of the present invention.

FIG. 1 shows a functional block of a flash memory in accordance with an embodiment. Memory cell array 1 is divided into at least two cell arrays 1t and 1c, which are disposed to sandwich a read/write circuit 2. At a data read time, bit lines BL and BLB disposed in the cell arrays 1t and 1c, respectively, are simultaneously selected as a bit line pair, which is coupled to a sense amplifier in the read/write circuit 2.

Plural word lines WL are disposed in the cell arrays 1t and 1c; and word line selecting/driving circuits (row decoders) 3t and 3c are disposed at the end of the word lines.

The read/write circuit 2 is formed, as described later, in such a manner that one page data may be read with little sense amplifiers; and it is possible to hold one page write data. Read data are output to external I/O terminals via a data buffer 4, and write data are loaded in the read/write circuit 2 via the data buffer 4.

Externally supplied address data "Add" is transferred to the row decoders 3t, 3c and column decoder (not shown) via address buffer 5 and address resister 6. Externally supplied command data "CMD" is decoded at command decoder 7 and transferred to an internal controller 8, thereby serving for operation controlling.

The internal controller 8 executes a sequence control of write, erase and read operations. To generate various high voltages, which are necessary for write, erase and read operations and boosted to be higher than the power supply voltage Vdd, there is prepared a high voltage generation circuit 9. This generates high voltages required in an operation mode under the control of the internal controller 8.

Figure 2:
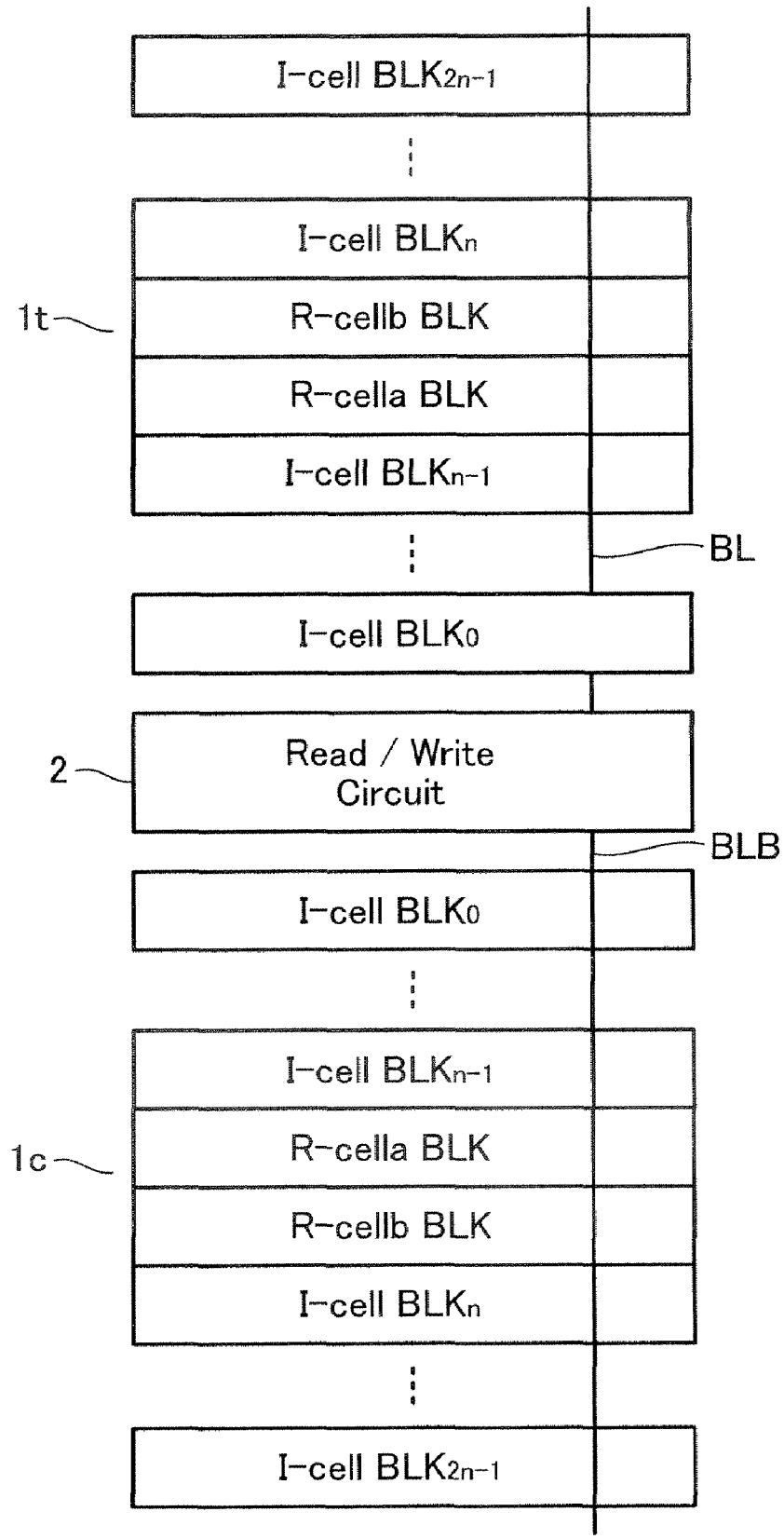
FIG. 2 shows the block configuration of the cell array in the flash memory.

FIG. 2 shows a block configuration of the cell arrays 1t and 1c. As shown in FIG. 2, in each of the cell arrays 1t and 1c, 2n information cell blocks I-cellBLKi(i=0 to 2n−1) are arranged. In each information cell block, "information cells" are arranged to store data.

In each of cell arrays 1t and 1c, at least one first reference cell block R-cellaBLK is disposed, in which "reference cells" R-cella are arranged for generating reference currents used for data sensing. In detail, when one information cell block I-cellaBLK is selected from the cell array 1t, reference cell block R-cellaBLK is selected from the cell array 1c, and the simultaneously selected information cell and reference cell are coupled to a pair of bit lines BL and BLB. Similarly, when one information cell block I-cellBLK is selected from the cell array 1c, reference cell block R-cellaBLK is selected from the cell array 1t.

In the example shown in FIG. 2, the reference cell block R-cellaBLK is disposed at about the center position in the information cell block arrangement in each of the cell arrays 1t and 1c.

Further disposed in each of the cell arrays 1t and 1c in addition to the first reference cell block R-cellaBLK, at least one second reference cell block R-cellbBLK with "reference cells" R-cellb arranged therein for generating a reference current necessary for write-verify and erase-verify of the first reference cell block R-cellaBLK.

As explained later, the reference cell in the first reference cell block R-cellaBLK is formed as being able to be written or erased with the same as cell structure as the information cell.

By contrast, although the reference cell in the second reference cell block R-cellbBLK is formed with basically the same as the information cell I-cell, it constitutes an inactive reference current source, in which write and erase are impossible.

Figure 3:
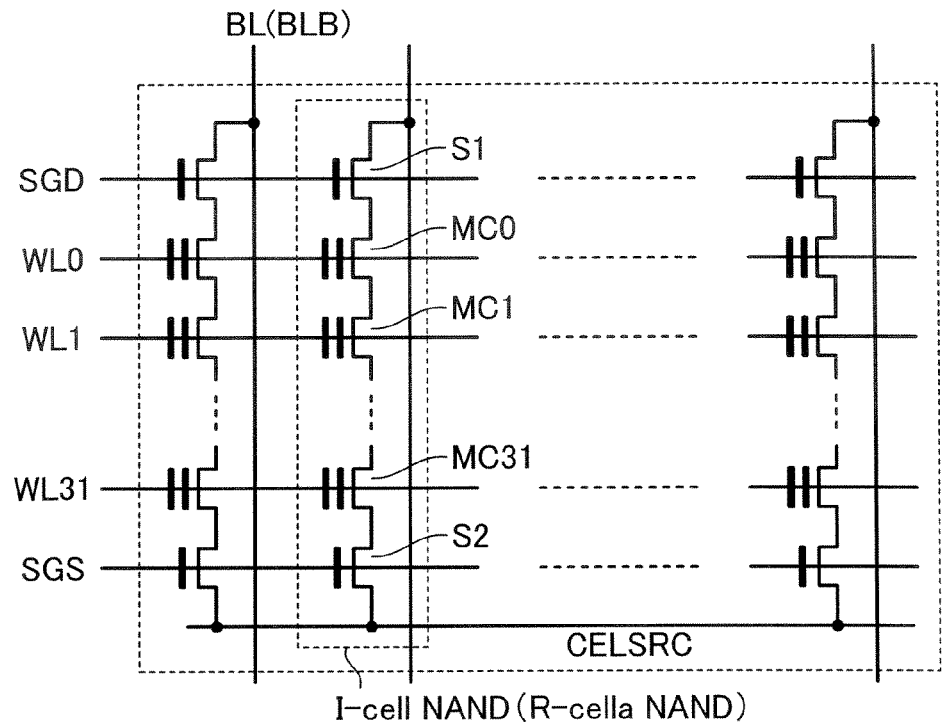
FIG. 3 shows an equivalent circuit of the information cell (I-cell) block and reference cell (R-cella) block.

FIG. 3 shows a common configuration of the information cell block I-cellBLK and the first reference cell block R-cellaBLK in detail. This block is formed of a plurality of NAND cell units (i.e., NAND strings), I-cellNAND or R-cellNAND, which are arranged in a matrix manner.

Each NAND string has a plurality of, thirty two in the example shown in the drawing, electrically rewritable and non-volatile semiconductor memory cells, MC0-MC31, connected in series. Each memory cell is a MOS transistor with a stacked gate structure of a floating gate and a control gate, which stores data in accordance with the carrier storage state of the floating gate in a non-volatile manner.

One end of the NAND string is coupled to a bit line BL(BLB) via a select gate transistor S1; and the other end to a common source line CELSRC via another select transistor S2.

Control gates of the memory cells MC0-MC31 are coupled to different word lines WL0-WL31, respectively. Gates of the select gate transistors S1 and S2 are coupled to select gate lines SGD and SGS, respectively, which are disposed in parallel with the word lines. A set of NAND strings sharing the word lines WL0-WL31 constitutes a "block" serving as a unit of data erase. Usually, there are prepared plural NAND string blocks in the direction of the bit line.

As shown in FIG. 2, each one selected in blocks arranged in each of cell arrays 1t and 1c is set as the first reference cell(R-cella) block R-cellaBLK. While it is optional which NAND blocks are used as the first reference cell blocks, once the first reference cell clocks R-cellaBLK are selected, it should be used fixedly as the first reference cell blocks hereinafter, and others are used as information cell blocks I-cellBLK.

Figure 4:
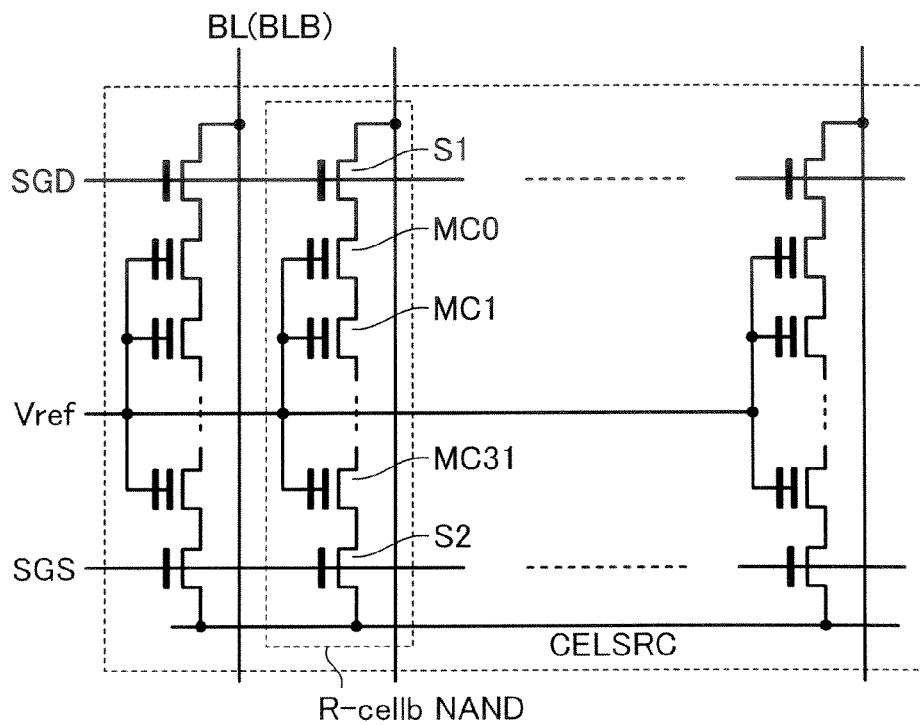
FIG. 4 shows an equivalent circuit of the reference cell (R-cellb) block.

FIG. 4 shows the configuration of the second reference cell block R-cellbBLK. This is formed of NAND strings, which are basically the same as the information cell block and the first reference cell block. However, in this NAND string R-cellbNAND, the control gates and floating gates of all memory cells MC0-MC31 are coupled to a common gate line, to which reference voltage Vref is applied. That is, the entire memory cells connected in series are operable as a reference current transistor in such a manner that the floating gates are applied with the reference voltage Vref.

The reference current source circuit used for detecting a cell current may be formed and disposed at the input node of the sense amplifier as being separated from the cell array. By contrast, according to this embodiment, in which all reference current sources are formed in the cell array with the same configuration as the cell array, it is unnecessary for using extra transistor areas and possible to obtain a current source with a small variation.

Figure 5:
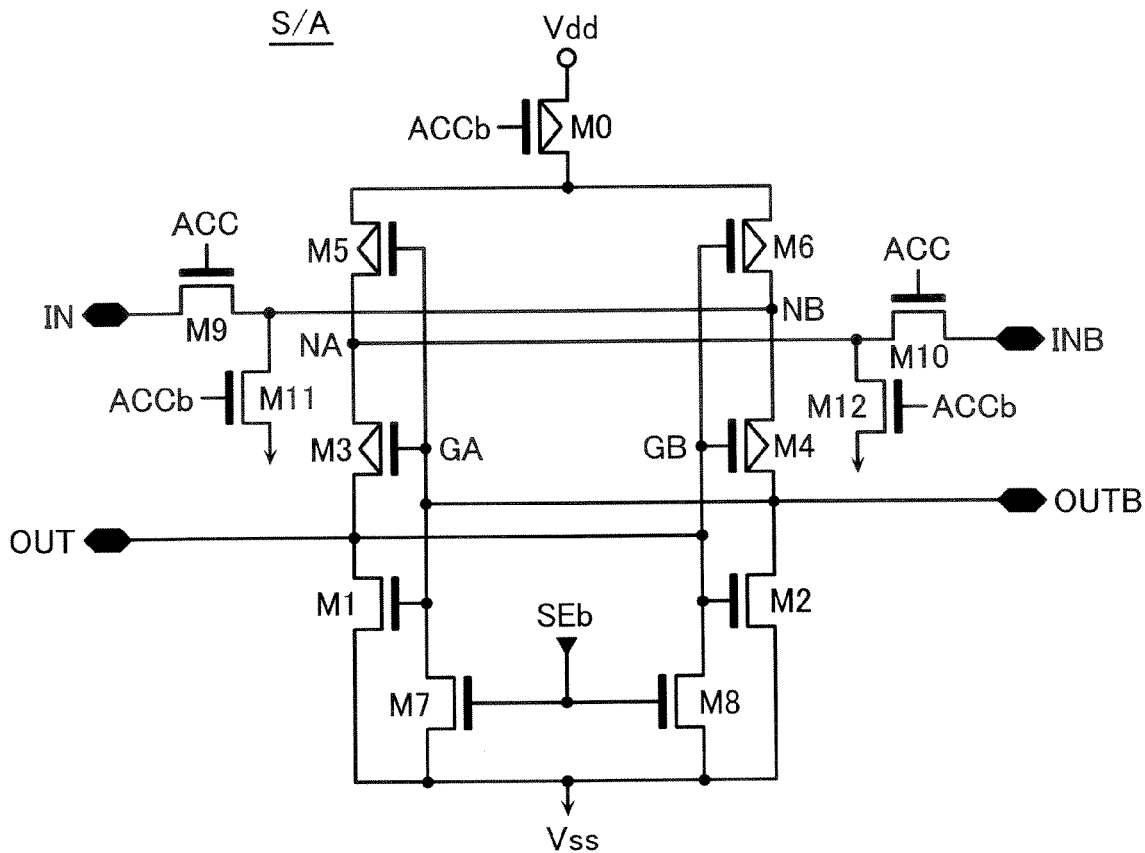
FIG. 5 shows the configuration of the sense amplifier S/A.

FIG. 5 shows a sense amplifier S/A used in the read/write circuit 2. This sense amplifier S/A is a current detecting type one, which has a latch as a main portion with PMOS transistors M3 and M4 and NMOS transistors M1 and M2.

The common drain of PMOS transistor M3 and NMOS transistor M1 connected in series with a common gate GA serves as one output node OUT. Similarly, the common drain of PMOS transistor M4 and NMOS transistor M2 connected in series with a common gate GB serves as the other output node OUTB. Common gates GA and GB are cross-coupled to the output nodes OUTB and OUT, respectively.

PMOS transistors M3 and M4 are coupled to the power supply node Vdd via PMOS transistors M5 and M6, respectively, and via a current source PMOS transistor M0.

Gates of PMOS transistors M5 and M6 are coupled to the common gates GA and GB, respectively. The gate of PMOS transistor M0 is controlled by an activation signal ACCb.

The sources of NMOS transistors M1 and M2 are coupled in common to the ground potential node Vss. The common gates GA and GB are coupled to the ground potential node Vss via NMOS transistors M7 and M8, respectively, the gates of which are controlled by a sense signal SEb.

Connection node NA between PMOS transistors M3 and M5 is coupled to an input node INB via NMOS transistor M10, which is controlled with an activation signal ACC. Connection node NB between PMOS transistors M4 and M6 is coupled to another input node IN via NMOS transistor M9, which is controlled with the activation signal ACC. These transistors M9 and M10 serve for distinguishing between a bit line precharge state and a sense amp waiting state, thereby making the sense amplifier operation time short and the power consumption small.

Disposed at the nodes NA and NB are reset-use NMOS transistors M11 and M12, which are driven by the activation signal ACCb. These transistors serve for setting the nodes NA and NB to be Vss when the sense amplifier S/A is inactive (i.e., ACCb="H").

The operation of this sense amplifier S/A will be explained below. In a normal data read mode, this sense amplifier detects a current difference between an information cell I-cell and a reference cell R-cella, which affects the input nodes IN and INB. In an inactive state while ACCb="H", and SEb="H", nodes GA, GB, NA, NB and output nodes OUT, OUTB are set at Vss because transistors M3, M4, M7 and M8 are on.

Figure 6:
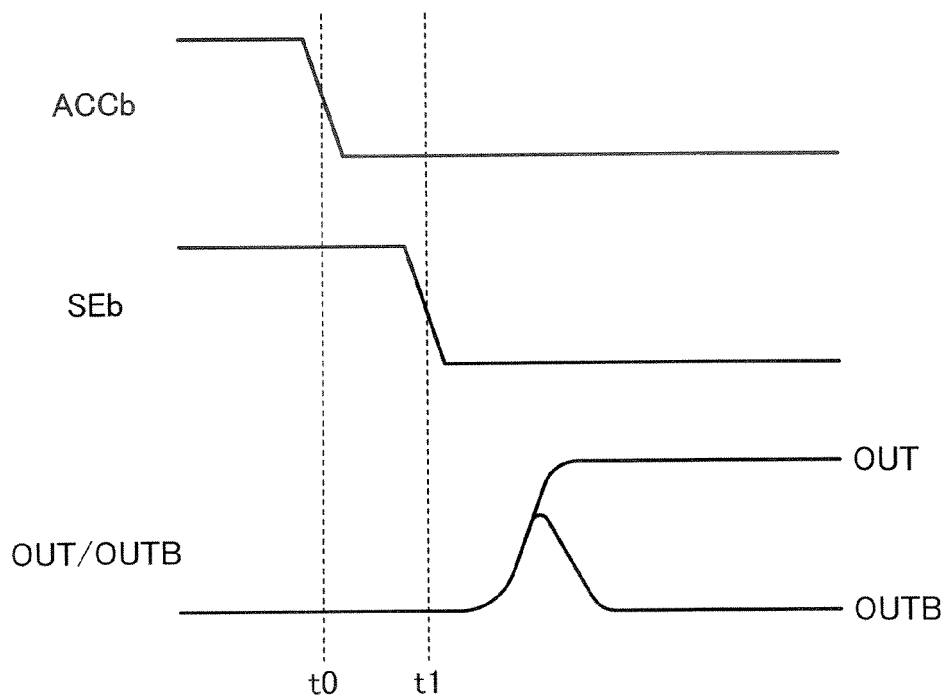
FIG. 6 shows the operation waveforms of the sense amplifier S/A.

When one word line is selected from each of two cell arrays, and one pair of bit lines BL and BLB are coupled to the input nodes IN and INB, as shown in FIG. 6, ACCb becomes "L" (timing to), and a little later SEb becomes "L" (timing t1), whereby the sense amplifier S/A is activated. Supposing that an information cell I-cell and a reference cell R-cella are coupled to the bit lines BL and BLB, respectively, cell currents thereof are supplied to the nodes NA and NB, respectively.

Just after the sense amplifier activation, while NMOS transistors M1 and M2 are kept off, PMOS transistor P0 is turned on; and NMOS transistors M7 and M8 are also turned on. Therefore, the output nodes OUT(=GB) and OUTB(=GA), which have been reset at Vss, will be charged up with the power supply current from Vdd and cell currents superimposed thereon.

A potential difference being generated between the output nodes OUT and OUTB (i.e., between the common gate modes GA and GB) based on the cell current difference, a positive feed back operation occurs to amplify the voltage difference between output noses OUT and OUTB, so that the voltage difference will be increased rapidly.

Supposing, for example, that OUT(=GB) is lower in potential that OUTB(=GA), in accordance with the positive feed back from SEb, NMOS transistor M1 becomes on; NMOS transistor M2 off; PMOS transistor M3 off; and PMOS transistor M4 on. As a result, output nodes OUT and OUTB will be set at Vss and Vdd, respectively.

To detect a small cell current such as a few or several hundreds nA with the current detecting type of sense amplifier shown in FIG. 5, it is in need of making the influence of variations in threshold voltage and gate length of the transistors as small as possible. For this purpose, it is necessary to make the gate length large to a certain degree, so that the occupied area becomes large. In the sense amplifier shown in FIG. 5, it is required of the NMOS transistors M9 and M10, which are connected to bit lines BL and BLB, to be formed as high breakdown voltage transistors, and this also causes the occupied area increasing.

Therefore, it is difficult to arrange the sense amplifier S/A shown in FIG. 5 in such a manner that adjacent two, even and odd, bit lines share a sense amplifier as well as in the ordinary NAND-type flash memory.

Figure 7:
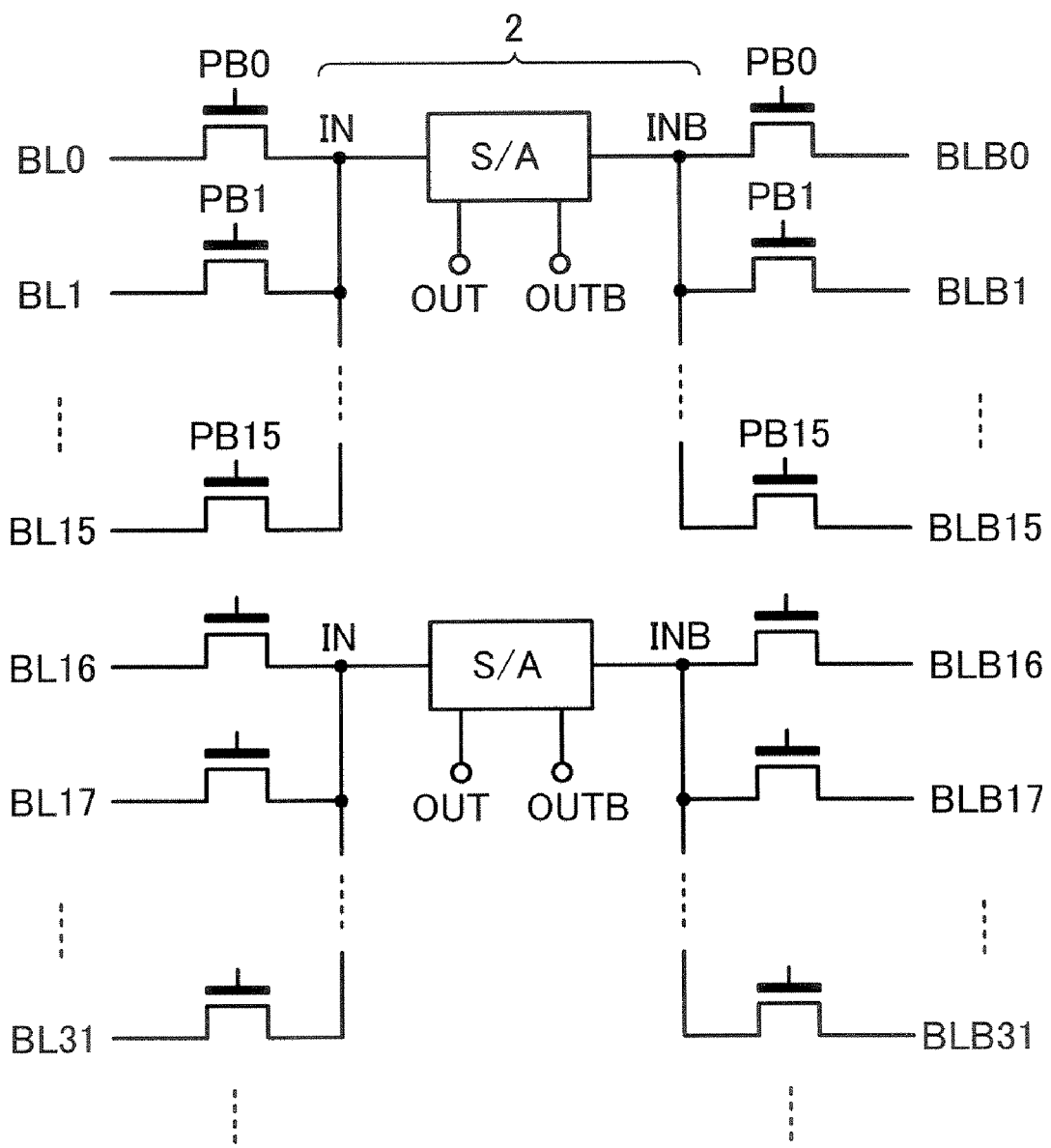
FIG. 7 shows the arrangement of bit lines and the sense amplifier.

In consideration of the above-described situation, as shown in FIG. 7, in this read/write circuit 2 in accordance with this embodiment, it is used such an arrangement that three or more bit line pairs share a sense amplifier S/A. In detail, in the example shown in FIG. 7, sixteen pairs of bit lines BL0-BL15, BLB0-BLB15 share a sense amplifier S/A. Disposed between the bit line pairs BL0-BL15, BLB0-BLB15 and the input nodes IN, INB of the sense amplifier S/A are select transistors, which are sequentially driven by select signals PB0-PB15 to scan pair by pair and couple the bit lines BL0-BL15 and BLB0-BLB15 to the input nodes IN and INB, respectively.

For example, suppose that the number of information cells simultaneously selected by a word line is N; and cell data are read out to N bit lines. Since, in this case, the number of sense amplifiers is 16/N, data of N information cells may be read out in response to the select signals PB0-PB15 sequentially set at "H".

Next, detailed embodiment will be explained for two cases, binary data storage scheme and four-level data storage scheme.

[Binary Sata Storage Scheme]

Figure 8:
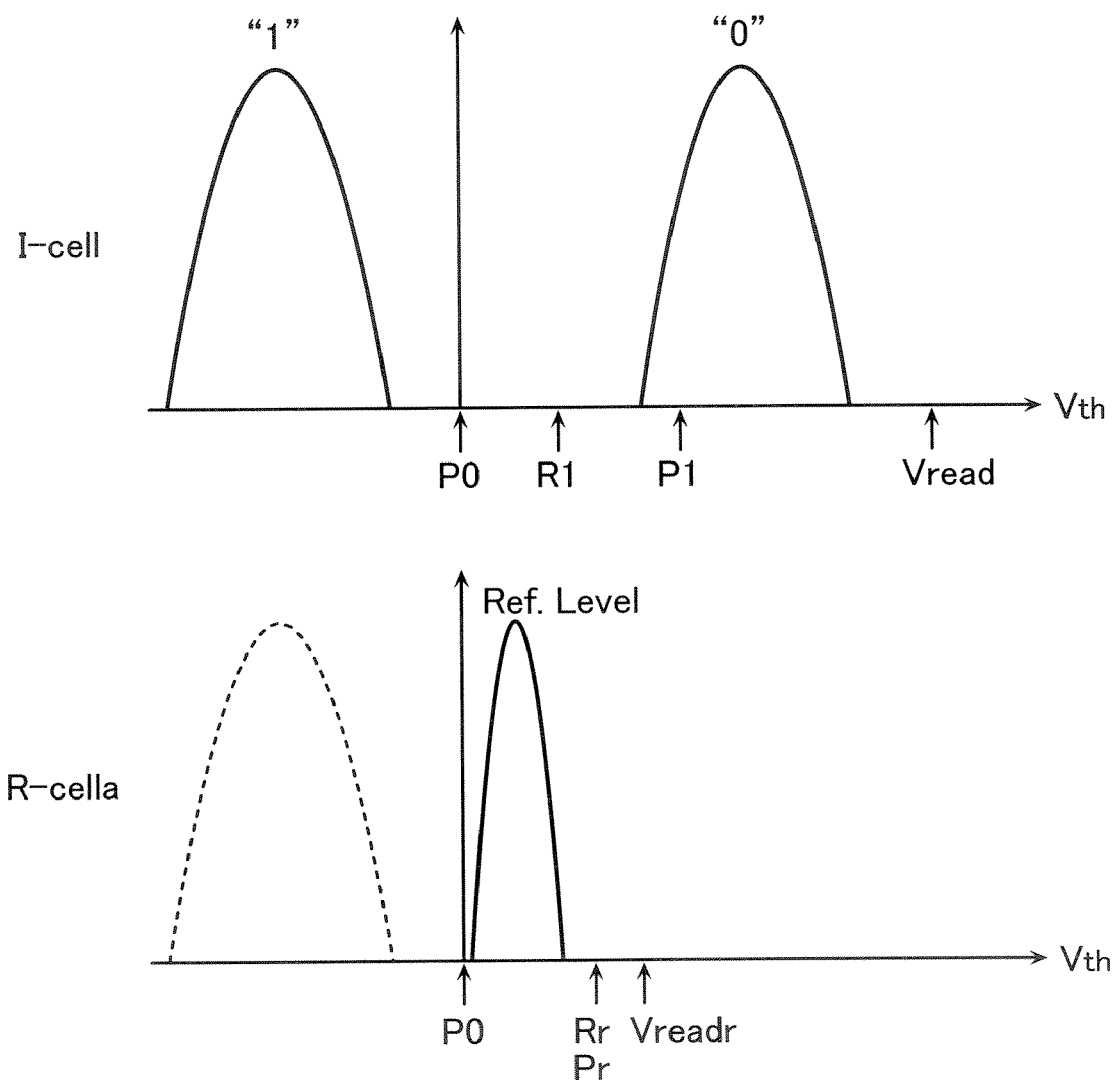
FIG. 8 shows a threshold distribution in the case of binary data storage scheme.

FIG. 8 shows a data threshold distribution of the information cell I-cell and reference cell R-cella in case of binary data storage scheme. Information cell I-cell stores one bit in such a way that a negative threshold voltage state (i.e., erased state) serves as data "1"; and a positive threshold voltage state (i.e., written state) as data "0". This is the same as that in the ordinary NAND-flash memory, and the write method also is the same as it.

The reference cell R-cella is written into a positive threshold voltage state near 0V, which serves as a reference level, from the same erased state as in the information cell. Write-verify of the reference level is performed in such a way that the reference cellos current is compared with the reference current flowing in the second reference cell R-cellb. For example, supposing that the verify-voltage applied to a selected reference word line is Pr, the threshold voltage serving as the reference level will be written.

At a read time or verify-read time in a write sequence of the information cell, the reference level of the reference cell R-cella is used. Explaining in detail with reference to FIG. 12, in a normal read mode, a selected word line on the information cell NAND, I-cellNAND, side, is applied with read voltage R1 set between the threshold voltages of data "1" and "0"; another selected word line (reference word line) on the reference cell NAND, R-cellaNAND, side, is applied with read voltage Rr near the reference level; non-selected word lines on the I-cellNAND side, read pass voltage Vread is applied, which is higher than the uppermost threshold voltage of data "0"; and non-selected word lines on the R-cellaNAND side is applied with read pass voltage Vreadr(<Vread) is applied, which is higher than the reference level.

As a result, the sense amplifier S/A coupled to a bit line pair, to which the information cell data and reference cell data are supplied, detects the cell current difference between the information cell and reference cell to sense data Supposing that the cell currents of data "1" and "0" of the information cell unit I-cellNAND are Ic(1) and Ic(0); and the cell current of the reference cell unit R-cell AND is Ir, it is obtained such a relationship as: Ic(1)>Ir>Ic(0). In case of data "1" (i.e., Ic(1)>Ir), the sense amplifier S/A outputs OUT="H"; and OUTB="L". While in case of data "0" (i.e., Ic(0)<Ir), it will be obtained OUT="L"; and OUTB="H".

Figure 12:
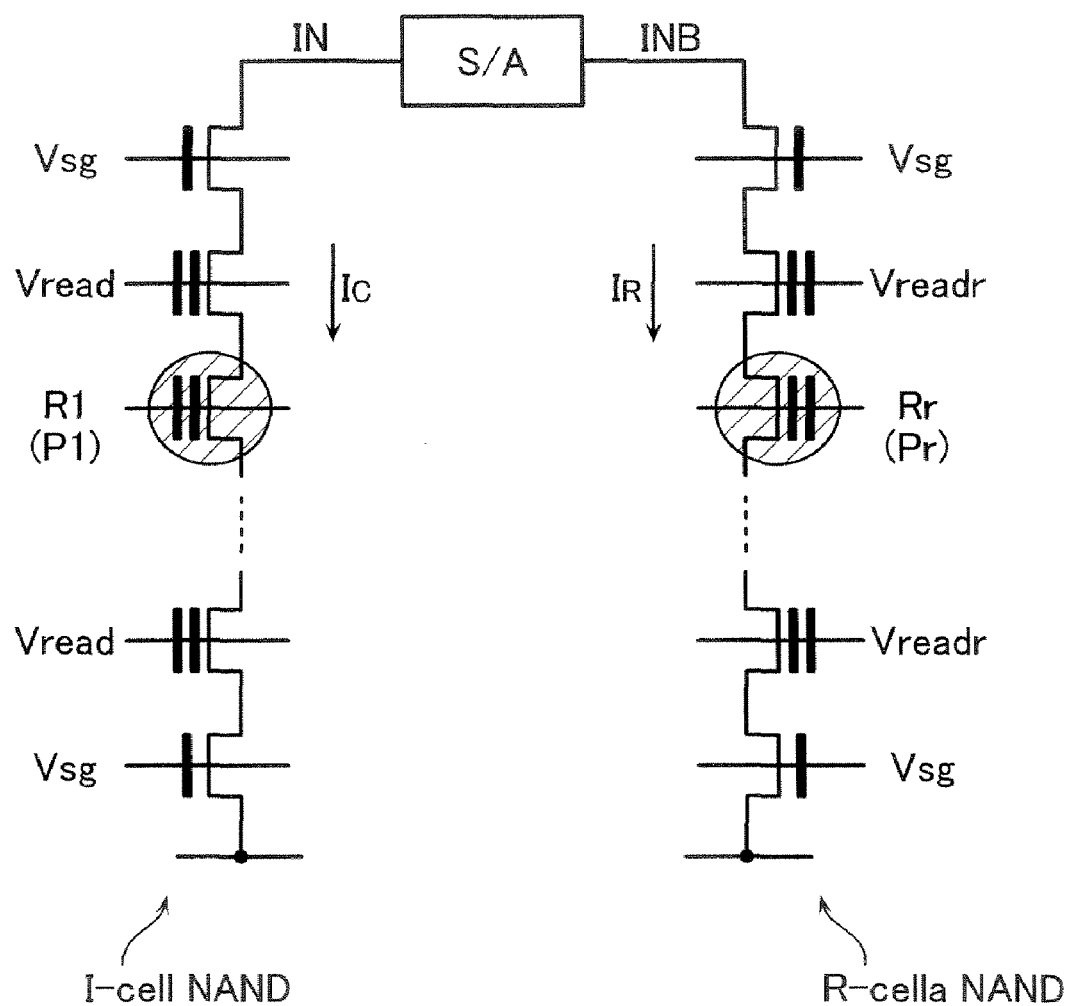
FIG. 12 shows a coupling relationship between the sense amplifier and the bit line and a bias condition at a read time.

As shown in FIG. 12, at a write-verify time, excepting that a selected word line and a reference word line are applied with verify voltages P1 and Pr, respectively, verify-read is performed with the same cell current comparison as at the normal read time. As a result, data write will be performed to satisfy such a condition that the lowest value of the threshold voltage of "0" data becomes about the verify voltage P1.

Figure 9:
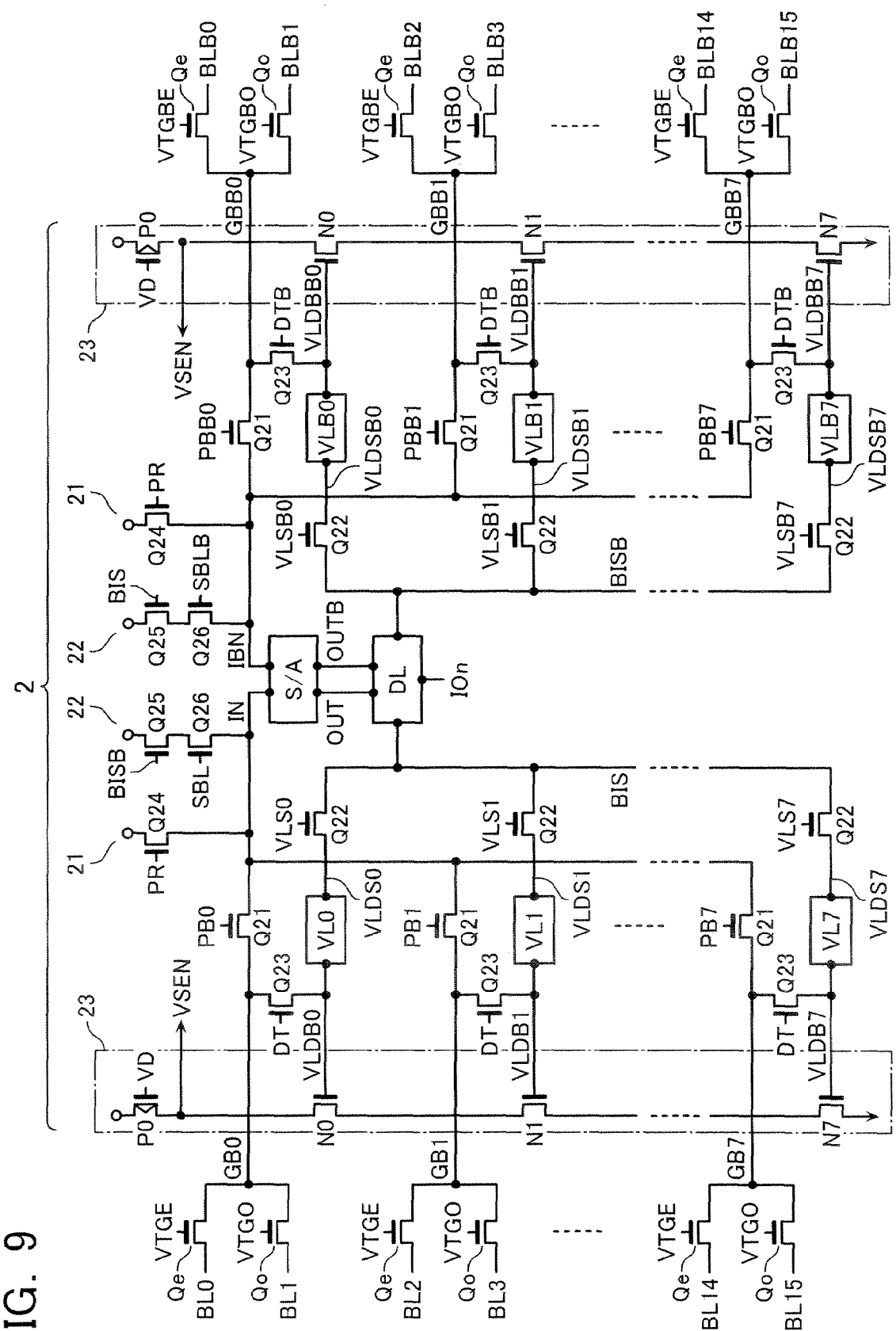
FIG. 9 shows the read/write circuit used in the binary data storage scheme.

FIG. 9 shows a detailed configuration of the read/write circuit 2. Shown here is such an example that 16 bit line pairs share a sense amplifier S/A. That is, a sense amplifier S/A is disposed to be connectable to 16 bit lines BL(BL0-BL15) on the cell array it side and 16 bit lines BLB(BLB0-BLB15) on the cell array 1c side.

Even bit lines and odd bit lines are selectively coupled to nodes GB0-GB7, GBB0-GBB7 via select transistors Qe and Qo, which are driven by signals VTGE and VTG0, respectively. These nodes GB0-GB7 and GBG0-GBG7 are coupled to the input nodes IN and INB via transfer transistors Q21 driven by signals PB0-PB7 and PBB0-PBB7, respectively.

Bit line select transistors Qe and Qo are high breakdown voltage ones; and the remaining transistors in the read/write circuit are low-voltage ones.

In FIG. 9, to hold write data, a set of data latches VL(VL0-VL7) are disposed on the bit line BL side, the number of which are the same as that of bit lines simultaneously selected; and another set of data latches VLB(VLB0-VLB7) are disposed on the bit line BLB side, the number of which are the same as that of bit lines simultaneously selected.

In the example shown in FIG. 9, 8 data latches VL0-VL7 are so disposed in corresponding to 16 bit lines on the bit line BL side as to share a data transfer node BIS. Similarly, 8 data latches VLB0-VLB7 are so disposed in corresponding to 16 bit lines on the bit line BLB side as to share another data transfer node BISB.

Basically, when cells on the bit line BL side are written, data latches VL are used while when cells on the bit line BLB side are written, data latches VLB are used. With the above-described latch circuit arrangement, it becomes possible to write data simultaneously in cells coupled to multiple bit lines (even bit lines or odd bit lines).

One data nodes of data latches VL are coupled to the nodes GB via transfer transistors Q23 simultaneously driven by signal DT, respectively. In a data write mode, on the control of these transfer transistors Q23, bit line voltage control is performed based on the write data stored in the data latches VL. The other data nodes of the data latches VL are coupled in common to the data transfer node BIS via transfer transistors Q22 driven by timing signals VLS (VLS0-VLS7), which are generated at different timings from each other. The data transfer node BIS is one node of latch-type transfer circuit (transfer control circuit) DL attached to the sense amplifier S/A.

As similar to this, one data nodes of data latches VLB are coupled to the nodes GBB via transfer transistors Q23 simultaneously driven by signal DTB, respectively. The other data nodes of the data latches VLB are coupled in common to the data transfer node BISB via transfer transistors Q22 driven by timing signals VLSB (VLSB0-VLSB7), which are generated at different timings from each other. The data transfer node BISB is the other one of the latch-type transfer control circuit DL.

Output nodes OUT and OUTB of the sense amplifier S/A are selectively coupled to data line IOn via the transfer control circuit DL. In addition, the output nodes OUT and OUTB are selectively coupled to data transfer nodes BIS and BIBB under the control of the transfer control circuit DL. That is, data transfer between the sense amplifier S/A and data latches VL are performed via the data transfer nodes BIS, and data transfer between the sense amplifier S/A and data latches VLB are performed via the data transfer nodes BISB.

While, as explained in detail later, write data are loaded in both of the data latches VL and VLB, one of the data latches are rewritten in accordance with a result of the verify-read for a selected cell array, and then serve for bit line voltage control; and the other store write data as it is for verify controlling until the write cycle ends.

In detail, at a write-verify time in each write cycle, bit line data are sequentially sensed by the sense amplifier S/A, and the sense data are transferred to the data latches VL or VLB via data transfer node BIB or BIBB, so that the write data in the data latches VL or VLB will be rewritten.

Disposed at the input nodes IN and INB of the sense amplifier S/A are precharge circuits 21. The pracharge circuits 21 have precharge transistors Q24, which are driven by signal PR to precharge the bit line pair of BL and BLB at a normal read time or verify-read time.

Further disposed at the input nodes IN and INB are verify-control circuits (pull-up circuits) 22, which serves for forcedly level-setting the output node OUT or OUTB at a verify-read time. In detail, this pull-up circuits 22 serve for preventing a "1" write cell at a write-verify time from being in a "0" write state in the following cycle, and dealing with it as "1" write again.

These pull-up circuits 22 are formed of transistors Q26 and Q25 connected in series, which are driven by timing signals SBL and SBLB, and the data on the nodes BISB and BIS, respectively.

Transistors N0-N7, which are connected in series to signal lines VSEN with gates coupled to one data nodes of the data latched VL, VLB, constitutes verify judging circuits 23. The signal lines VSEN are precharged by precharge transistors P0. If, at a write-verify time, all data in data latches VL, VLB become "0" (i.e., all data nodes VLDS are "0", or all data noses VLDSB are "0"), transistors N0-N7 turn on, thereby discharging the signal line VSEN, so that write completion will be judged.

Figure 10:
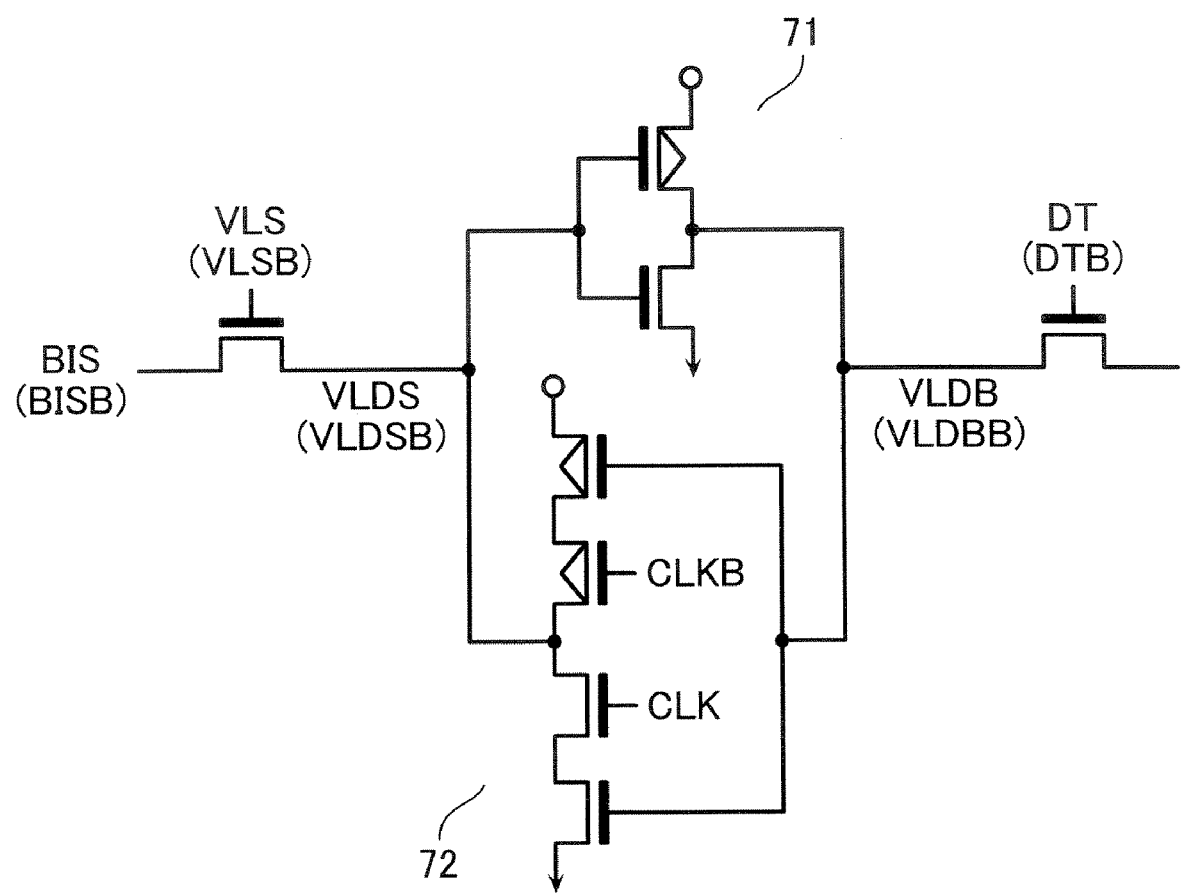
FIG. 10 shows the configuration of data latch VL shown in FIG. 9.

FIG. 10 shows a configuration of data latches VL, VLB. This latch circuit uses a combination of a normal CMOS inverter 71 and a clocked CMOS inverter 72, so that it is easy to do data inverting operation.

Figure 11:
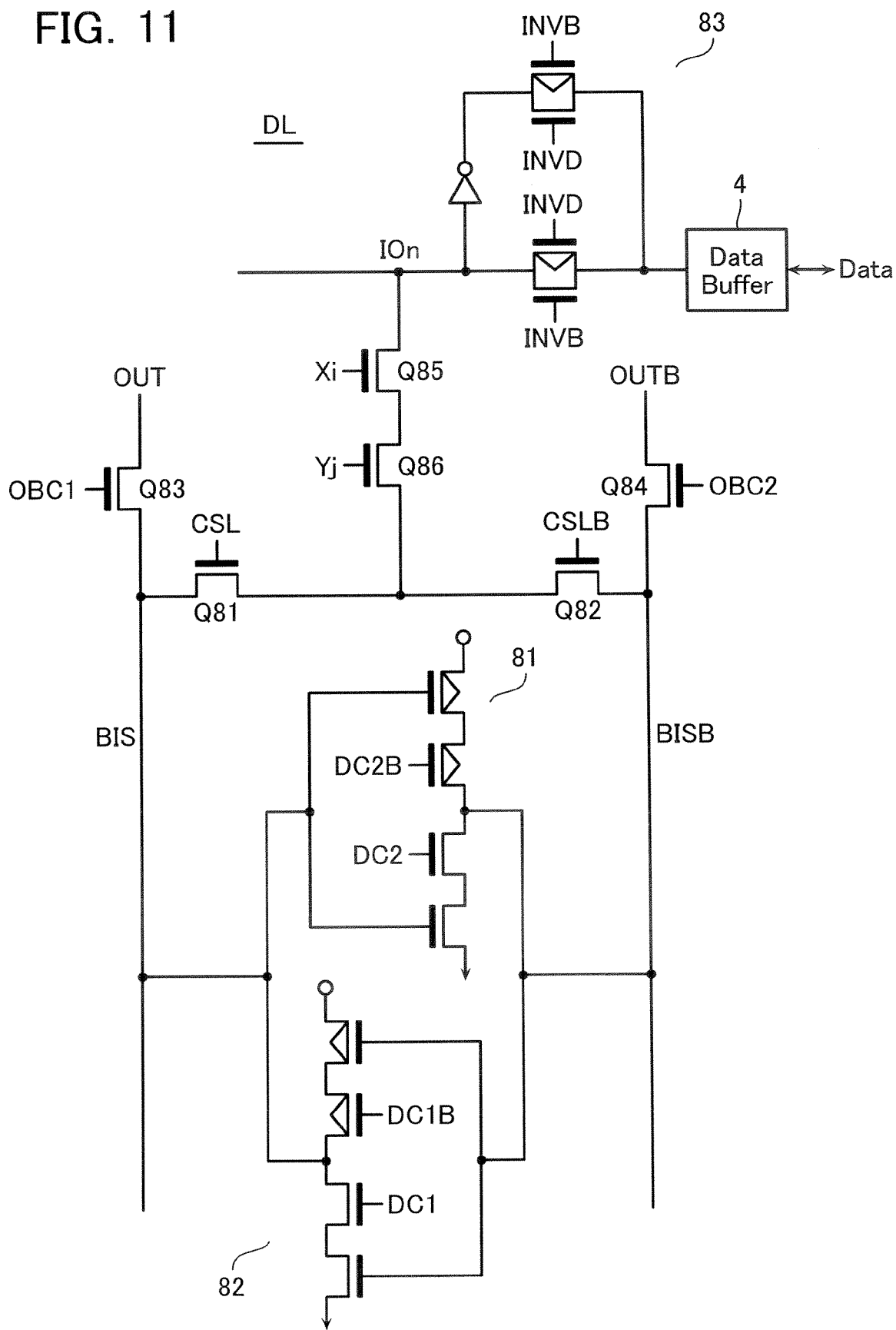
FIG. 11 shows the configuration of transfer control circuit DL shown in FIG. 9.

FIG. 11 shows the latch type of transfer control circuit DL, which has a latch circuit constituted by a combination of clocked CMOS inverters 81 and 82. Data transfer nodes BIS and BISB are common nodes shared by data latches VL and VLB, respectively. These nodes BIS and BISB are selectively coupled to internal data line IOn via transistors Q85, Q86, Q81 and Q82, which are driven by Xi, Yi, CSL and CSLB, respectively. Between output node OUT and data node BIS, and between output node OUTB and data node BISB, there are prepared transistors Q83 and Q84, which short-circuit these nodes with gate signals OBC1 and OBC2, respectively.

In addition to the coupling control between data latch VL, VLB and output nodes OUT, OUTB of the sense amplifier, and between output nodes OUT, OUTB and data line IOn, the data transfer control circuit DL performs data inverting operation and the like.

Next, the binary data storage operation with the read/write circuit 2 shown in FIG. 2 will be explained in detail below.

(Write Operation)

Prior to data writing, it is in need of performing collective erase for a selected block in the cell array $1t$ or $1c$ and performing reference level writing for a reference cell block R-cellaBLK. These will be explained in brief.

Erase for a selected information cell block I-cellBLK in the cell array $1t$ is performed as an electron releasing operation of the floating gates of the memory cells in the block with applying 0V to all word lines and with applying erase voltage Vera to the well, on which the cell array is formed. At this time, for erase-verifying, the reference cell block R-cellbBLK in the cell array $1c$ will be used.

That is, verify voltage P0 (shown in FIG. 8) is applied to all word lines in the selected information cell block; and reference voltage Vref is applied to the reference cell block R-cellbBLK. Detecting that the cell current becomes larger than the reference current, the erase operation ends.

When an information cell block in the cell array $1c$ is erased, the reference cell block R-cellbBLK in the cell array $1t$ is referred to. Erase of the reference cell block R-cellaBLK will be performed like the above description.

Written into the reference cell block R-cellaBLK is the reference level as shown in FIG. 8. To write this reference level, it is necessary to sequentially select the reference word lines and write the reference level to all reference cells in the reference cell block R-cellaBLK.

This reference cell write-verify also is performed in such a way that when the reference cell block R-cellaBLK is written in one cell array, the reference cell clock R-cellbNBLK is referred to in the other cell array. That is, at the verify-read time with the verify voltage Pr shown in FIG. 8, it will be verified that the cell current of a to-be-written reference cell R-cella becomes smaller than the reference current of a reference cell R-cellb with the reference voltage Vref applied.

Next, supposing that the reference level has been written into the reference cell block R-cellaBLK, a binary data writing operation of the information cell block will be explained below.

Figure 13:
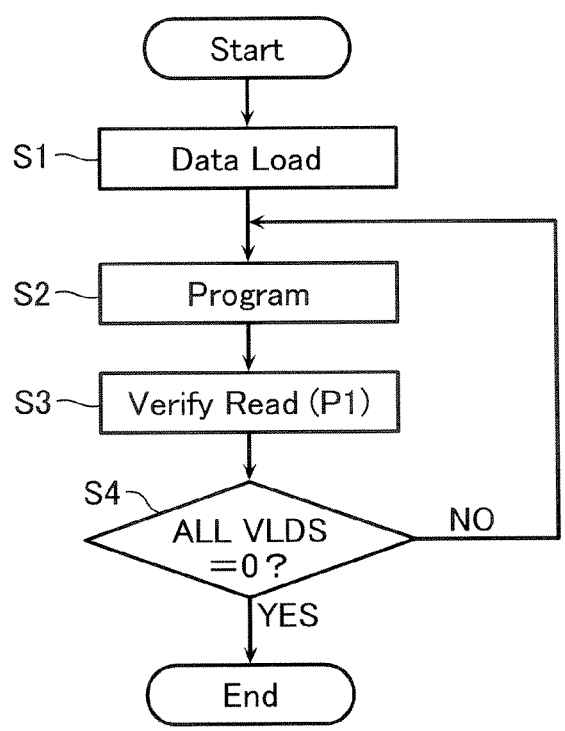
FIG. 13 shows a binary data write sequence.

FIG. 13 shows a binary data write sequence. Following the command input, a selected page address and write data are loaded (step S1), and then write voltage application is performed for a selected word line (step S2). After having applied the write voltage, write-verify is performed for verifying the write state (step S3).

Next, it will be judged a write completion, i.e., whether data latches VL (or VLB) are in an all "0" state (i.e., all VLDS="0", or all VLDSB="0") or not (step S4). If there is a sufficiently "0"-written cell in the selected page, the write cycle will be repeated until all "0" write has been confirmed.

Here, it will be explained such a case that the information cells (memory cells) coupled to even numbered bit lines (BL0, BL2, BL4, . . . ) on the bit line BL side are simultaneously written. In this case, it is required of a bit line BL to be applied with Vdd for a "1" write cell (write-inhibit cell) while it is applied with Vss(=0V) for a "0" write cell.

In the write mode for writing memory cells on the bit line BL side, an external write data bit is loaded in the data latch VLB0 on the bit line BLB side via the data line IOn. In detail, with Xi=Yj=CSLB=VLSB0=CLKB="H", and CLK="L", the data on the data line IOn is transferred through the data node BISB and the transfer transistor Q22 to be loaded in the data latch VLB0.

At the same time, with DC2B=VLS0="H", and DC2="L", inverted one of the write data is loaded in the data latch VL0 on the bit line BL side. In detail, the write data transferred to the data node BISB is inverted by the inverter 81 in the latch type transfer circuit DL, and transferred to the data latch VL0 via the data transfer node BIS and the transfer transistor Q22.

The above-described data loading operation is repeated with VLS0-7, VLSB0-7 sequentially set to be "H", thereby resulting in that one set of data latches VLB<7:0> and the other set of data latches VL<7:0> store complementary write data. The write data in the data latches VLB on the bit line BLB side are kept as write-verifying use write data as it is until the write sequence ends. The write data in the data latches VL are used for applying write control voltages to the selected bit lines, i.e., as such write data as being rewritten in accordance with the write-verify results at each write cycle.

When an externally loaded data bit is "1", VLDB becomes Vdd; and VLDBB Vss(=0V), and this becomes data "1" write mode for applying Vdd to the bit line BL. While, when the externally loaded data bit is "0", VLDB becomes Vss; and VLDBB Vdd, and this becomes data "0" write mode for applying Vss to the bit line BL.

Note here that the data latched in data latch VL and VLB will be expressed by the values at the nodes VLDS and VLDSB, respectively, hereinafter.

To transfer the data stored in the set of data latches VL to the even numbered bit lines (BL0, BL2, BL4, . . . ), the select transistors Qe are turned on with the signal VTGE="H", and at the same time, transistors Q23 are turned on with the signal DT="H". As a result, certain voltages in accordance with data in the data latches VL<7:0> are supplied to the bit lines (BL0, BL2, BL4, . . . ) simultaneously.

A sector formed of a set of memory cells selected by even numbered bit lines and a word line constitutes a page, in which data are simultaneously written. Since, at this time, it is necessary to prevent memory cells coupled to non-selected odd numbered bit lines from being written, the non-selected bit lines also are applied with Vdd as well as "1" write cells.

With respect to the selected block, the select gate line SGD on the bit line side is applied with Vdd; the select gate line SGS of the source line side with Vss; the selected word line with write voltage Vpgm (for example, 20V); and non-elected word lines with pass voltage Vpass (for example, 10V).

If the bit line is 0V, the corresponding cell channel becomes 0V. Therefore, electrons will be injected into the floating gate of the selected cell with Vpgm applied. In case the bit line is Vdd, the cell channel becomes floating, and it will be boosted in potential by capacitive coupling from the control gate with Vpgm applied, thereby preventing the cell from being written (i.e., electron injection into the floating gate does not occur).

In case the memory cells on the bit line BLB side are written, external write data are sequentially loaded in the data latches VL as verify-use data; and inverted data thereof are loaded in the data latches VLB, which are used as write data for supplying certain voltages to the bit lines. With the data loaded in the data latches VLB, the same data write operation as described above will be performed.

(Write-Verify Read Operation)

Verify-read operation after write operation will be performed with a cell current comparison between a selected cell (information cell) on the bit line BL and a reference cell on the bit line BLB. At this time, verify voltages applied, as shown in FIG. 12, to the selected word lines on the information cell side and the reference cell side are P1 and Pr, respectively, which are shown in FIG. 8.

That is, the verify-voltages P1 and Pr are selected in such a way that in case cell data is "1", the relationship between the cell currents Ic and Ir is represented by Ic>Ir while in case cell data is "0", it is represented by Ic<Ir.

A detailed verify-read operation will be explained with reference to the read/write circuit 2 shown in FIG. 9. The sense amplifier S/A is initially set in such a state that all of the input nodes IN, INB and output nodes OUT, OUTB is set at Vss(=0V) with ACCb=SEb="H" and ACC="L".

A bit line pair is selected in response to a selected address. For example, in case verify-read is performed for a selected cell on a bit line BL0, bit lines BL0 and BLB0 are selected to be coupled to the input nodes IN and INB with VTGE=VTGEB="H"(=5V), and PB0=PBB0=Vdd. Then the precharge circuits 21 are turned on with PR="H" to precharge the bit lines BL0 and BLB0.

After the bit line precharge, in response to ACCb="L", and ACC="H", the input nodes IN and INB, which are coupled to the bit lines BL0 and BLB0, are coupled to the nodes NB and NA in the sense amplifier S/A, respectively, so that the sense amplifier S/A starts to supply current to the bit lines BL0 and BLB0. Thereafter, the difference between the cell current Ic and reference current Ir will be amplified in response to SEn="L".

In case the cell current Ic of the selected information cell on the input IN is larger than the reference current Ir of the selected reference cell on the input node INB, there is provided OUT="H" in accordance with the positive feedback of the sense amplifier. If the cell current difference is revered to it, there is obtained OUT="L". This is the same as in the normal read mode.

Verify-read data on the output OUT is transferred to data latch VL0 via transfer transistor Q22 with VLS0="H" applied. To transfer data to the data latch VL0, CLKB and CLK are set to be "H" and "L", respectively.

Therefore, in case "0" data has been written into the selected information cell (i.e., in case of OUT="L"), the data latch VL0 is set in a state of VLDS=0V and VLDB=Vdd, which serves for write-inhibiting ("1" writing) hereinafter. While in case "0" write is insufficient, the data latch VL0 is set to be in a state serving for writing "0" again.

When the selected information cell is a "1" write cell, the output becomes OUT="H" at the verify-read time. If this data is transferred to the data latch VL0 as it is, the data state becomes a "0" write state in the following cycle. This is not desirable. Accordingly, it is required of the "1" write cell to be subjected to such a verify-read data processing that the cell becomes in the "1" write state again in the following cycle.

For this purpose, prior to the bit line precharge for verify-read operation, such a data process is performed as follows: in case of the verify-reading for the bit line BL0, the write data in the data latch VLB0 is transferred to the data node BISB with VLSB0="H"; and then bit line precharge is performed.

If data of the latch VLB0 is "1", and write data in the selected information cell on the bit line side is "1", when the signal SBL is set to be "H" at the verify-read time, the pull-up circuit 22 on the bit line BL side is turned on. As a result, the input node IN of the sense amplifier S/A is forcedly charged-up, thereby making the output node OUT "L".

That is, the sense amplifier S/A is controlled in such a way that the verify-read result for the "1" write cell brings a "1" write state in the following cycle as similar to the case of "0" write.

The same verify-read operations as described above will be sequentially performed for eight bit lines BL0, BL2, BL14 with one sense amplifier S/A. As a result of the verify-read operations, data latches VL are set as follows: in case of "0"

write has been performed, and "1" write has been performed, VLDB="H"(="1") while in case of sufficiently "0" write, VLDB="L".

To detect whether one page information cells have been written or not, the collective verify-judging circuit 23 shown in FIG. 9 is used. If all "0" write has been finished, it is obtained VLDB<7:0>=Vdd. At this state, Vdd-precharged node VSEN in the verify-judge circuit 23 on the bit line BL side will be discharged to be Vss. As a result, write completion is detected. If the signal line VSEN is not discharged, the next write operation will be performed.

To perform verify-read for an information cell on the bit line BLB side, data of the data latch VL on the bit line BL side is transferred to dada node BIS, and the signal SBLB is set at "H"; and data at the output node OUTB of the sense amplifier S/A is transferred to the data latch VLB. These are different from the above-described verify-read for the information cell on the bit line BL side, but the remaining operations are the same as the above-described verify-read operation.

(Normal Data Read)

A normal data read will be performed by detecting cell current different between an information cell selected from one cell array and a reference cell selected from the other cell array. Except the read bias condition, the normal data read is the same as the write-verify read operation.

For example, in case of reading one page information cells defined by even numbered bit lines (BL0, BL2, ... ) and a selected word line on the bit line BL side, one page reference cells defined by even numbered bit lines (BLB0, BLB2, ... ) and a selected word line on the bit line BLB side, in which the same reference levels have been written, are simultaneously selected.

The bit line data are sequentially selected by select signals PB0-PB7 and PBB0-PBB7 and sensed at the sense amplifier S/A. Basically, the sensed data will be serially transferred through the data line IOn and output to the external.

For example, suppose that each of the cell arrays 1t and 1c has 16384 bit lines; and 16 bit lines share one sense amplifier S/A. In this case, 1024 sense amplifiers are disposed for one bank defined by the two cell arrays 1t and 1c. That is, sensible bit numbers are 1024 when one word line is selected.

It takes about 100 ns to perform a sense operation with the sense amplifier S/A shown in FIG. 5. However, it takes 2 μs to 3 μs to select a word line because it is in need of applying a high pass voltage to non-selected word lines.

In consideration of the above-described situation, one preferable method of performing high-speed data read is to sequentially couple the selected bit lines to the sense amplifier S/A in such a state that a selected word line is kept in the selected state. On the other hand, it is required of a NAND-type flash memory to apply a high pass voltage to non-selected word lines. If it takes a long time to drive the word lines, there is a fear of erroneous write of memory cells. Therefore, it is necessary to make the word line drive time as short as possible.

Figure 14:
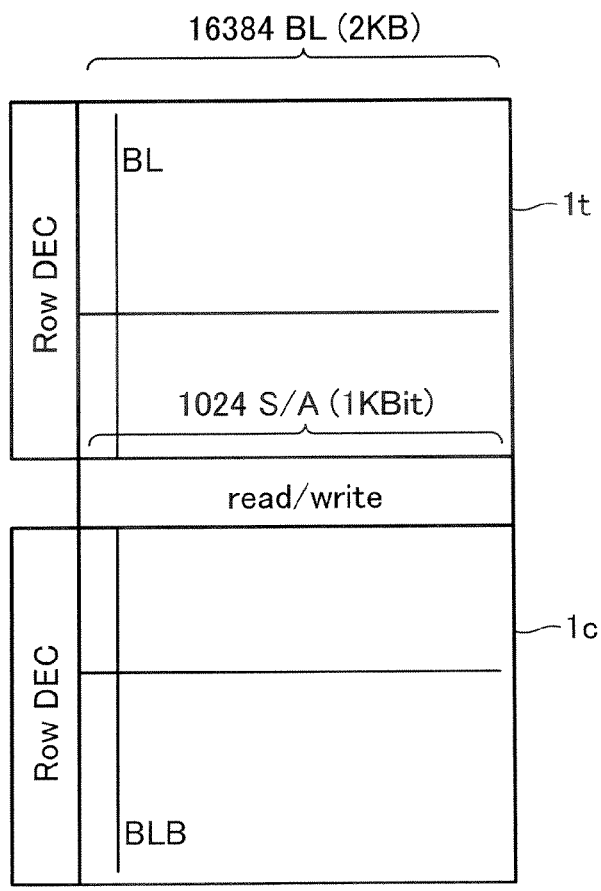
FIG. 14 shows an arrangement of bit lines in the cell array and the sense amplifiers.

In the example shown in FIG. 14, the number of bits, which may be sensed at a time, is 1024. To output such data, supposing that a unit time is 30 ns per 16I/O (i.e., 16 bit parallel output), it takes 30[ns]×1024[bits]/16[I/O]=1920[ns]. This means that it is impossible to output all data read out from a selected bit line during a sensing time of 100 ns for the following selected bit line. In this case, it is impossible to make the high-speed property of the sense amplifier usable.

One preferred and useful method for achieving a high-speed data read is to use the data latches VL and VLB, which are basically used in the data write mode, as caches in a data read mode. For example, in case data of the bit line BL0 is sensed, transfer the sensed data to data node BIS with the signal OBC="H", and then store it in the data latch VL0 with VLS0="H". At this time, CLK="L", and CLKB="H" are applied to the data latch VL0. During this data read time, the data latches in the latch type transfer circuit DL are kept inactive with DC1=DC2="L", and DC1B=DC2B="H".

Sequentially performing the above-described data transfer operations for selected bit lines, the sensed data from the selected bit lines BL0, BL2, ... , BL14 may be cached in data latches VL<7:0>.

When outputting the cached data in the data latch VL0, VLS0, CSL, Xi and Yj are set to be "H". Assuming that data line IOn has been precharged at Vdd as an initial state, in case data of the data latch VL0 is Vdd, the data line IOn is kept as it is while in case of data is Vss, it discharges the data line IOn, thereby being able to output data to the external.

With this technique, it becomes possible to make the selecting time of the word lines as short as possible. Additionally, during outputting data cached in the set of data latches VL, it is possible to select other word line to perform a next data read operation. Note here, if the cached data in the set of data latches VL are transferred to data line IOn via the data node BIS, during this data outputting, it is impossible to transfer the following sensed data on the bit line BL side to the set of data latches VL.

To improve this problem, it is effective to alternately cache the sensed data in the data latches VL and VLB. With this technique, it becomes possible to perform such a burst read operation without breaking that during outputting the sensed data in the data latch VL, cache the following sensed data in the data latch VLB.

The above-described high-speed data read may be achieved in such a manner that for example, one cell array 1t is read out, following it the other cell array 1c is read out. By use of this scheme, it becomes possible to do the following two operations simultaneously: data outputting operation for outputting the sense data of the cell array 1t, which is stored in data latches VL, via the data node BIS; and data transferring operation for transferring sense data of the cell array 1c to data latches VLB via the data node BISB.

Figure 15:
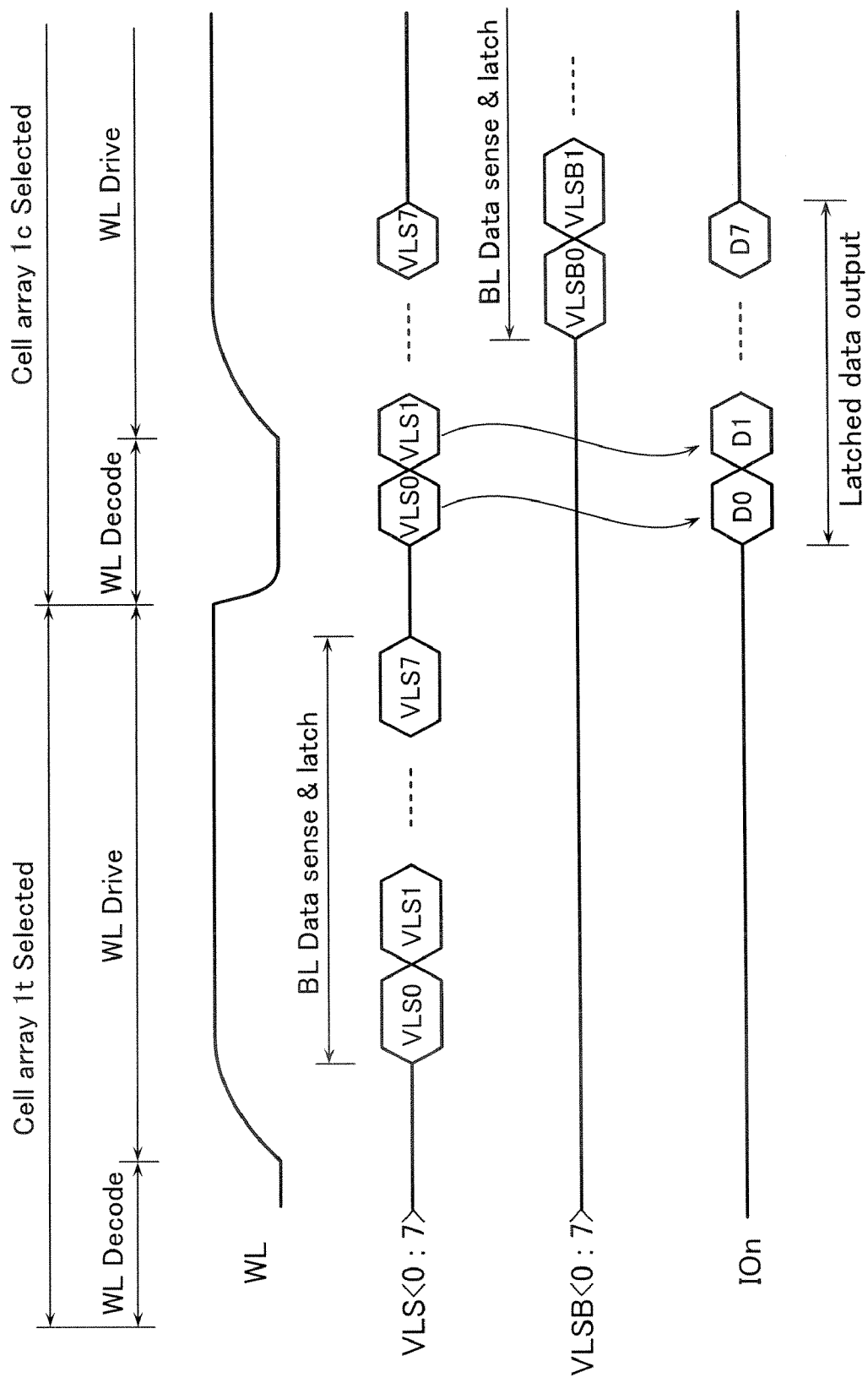
FIG. 15 shows a timing chart of high-speed data read operation.

FIG. 15 is a timing chart showing such the data read operation. A word line is selected in one cell array 1t, and bit line data are sequentially sensed, transferred and stored in data latches VL0-VL7 with select signals VLS0-VLS7. These sensed data in data latches VL0-VL7 are sequentially output via the data line IOn 16-bit by 16-bit in parallel. During this data outputting, the sense amplifier S/A and data latches VLB are not used. Therefore, as shown in FIG. 15, while the cell data on the bit line BL side are output, it is possible to do data sense on the bit line BLB side, and transfer the sensed data to data latches VLB0-7.

Further, in case data read of the cell array 1t is followed by data read of the cell array 1t, data cache may be controlled in such a way that the preceding sensed data are cached in data latches VL, and the following sensed data are cached in data latches VLB. In this case, if data at the output node OUTB is transferred to data latch VLB as the sense data on the bit line BL side with OBC2="H", this data is reversed in logic to that in data latch VL.

In consideration of this situation, when data in the data latch VLB is output, it should be inverted at a data inverting circuit 83 shown in FIG. 11 with INVD"H" and INVB="L". If it is not necessary to invert data, the data will be output as it is with INVD="L" and INVB"H".

Alternatively, the sensed data on the output node OUT being transferred to data latch VLB, it is not required to do the above-described data inverting process. In this case, the output node OUT is coupled to data node BISB with OBC1 being "H" on the OUT-BIS side, and CSL=CSLB is set at "H" simultaneously. VLSB0 being "H" at this state, the sensed data on the output node OUT may be transferred to data latch VLB0.

When cached data in the data latch VLB is output to data line IOn, VLSB=CSLB=Xi=Yj is set to be "H". This is the same as that of the cached data in data latch VL, and there is no need of data inverting.

In the embodiment described above, the number of bit lines to be simultaneously read/written is a half of the entire bit line (i.e., even bit lines or odd bit lines). Therefore, two bit lines share a data latch VL and a data latch VLB. By contrast, in case all bit lines are subjected to read/write operation, data latches VL and VLB will be disposed for bit lines BL and BLB, respectively, one by one.

[Four-Level Data Storage]

Next, it will be explained below such an embodiment that a four-level data storage scheme is adapted.

Figure 16:
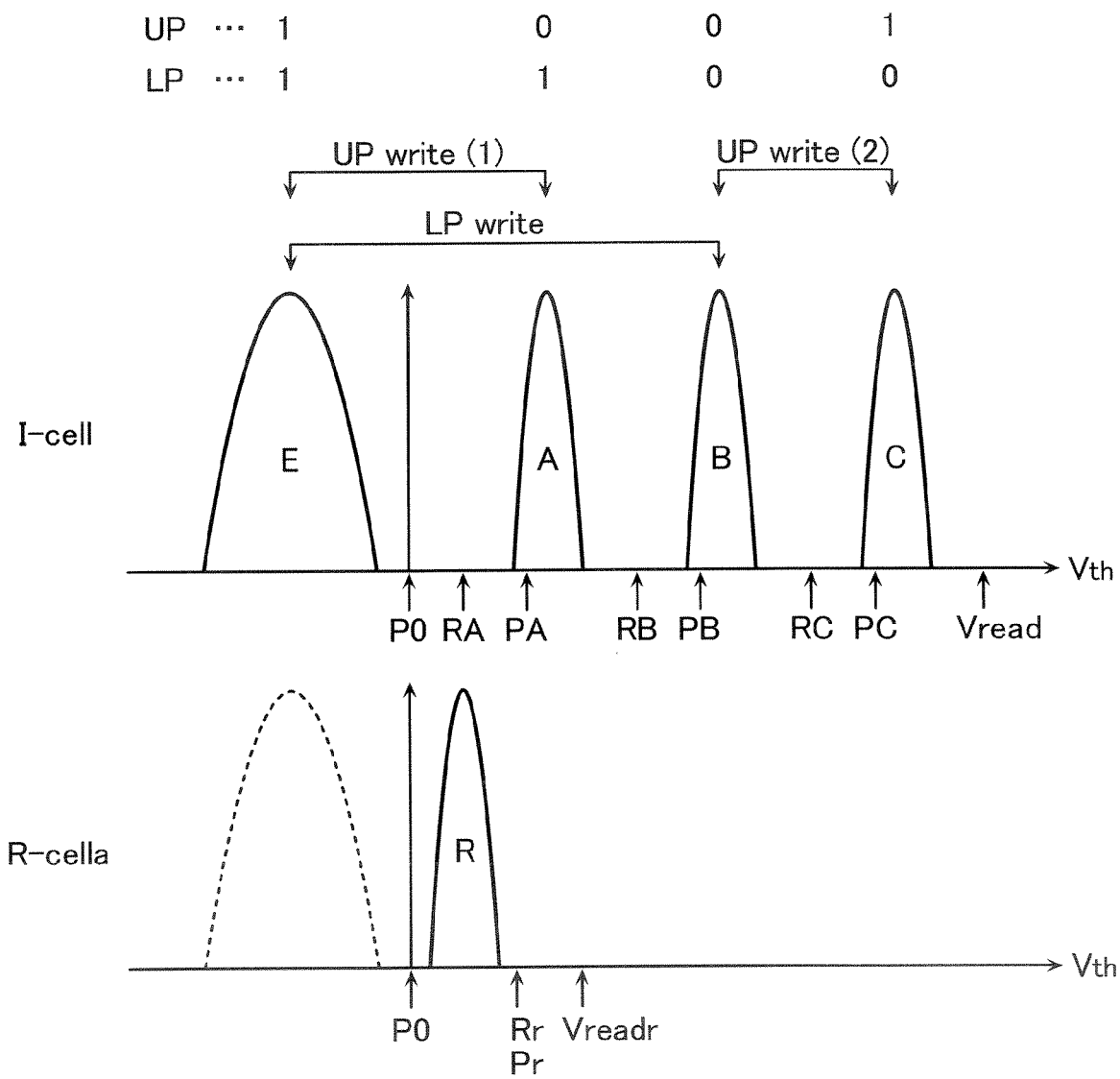
FIG. 16 shows a data threshold distribution in the case of four-level data storage scheme.

FIG. 16 shows a data threshold distribution with respect to the information cell I-cell and reference cell R-cella. As shown in FIG. 16, one of four data threshold states E, A, B and C levels (where, E<A<B<C) is set in an information cell I-cell.

Data state E is an erase state with a negative threshold voltage. In accordance with externally input write data, in case write data is "0", selected E-level cell's threshold voltage is increased to that of data state B. In case write data is "1", data write is inhibited, and cell data level is not changed. This threshold level shift is referred to as "lower page (LP) write", hereinafter.

Data write from data state E to data state A, and from B to C are referred to as "upper page (UP) write", hereinafter. To-be-written levels at this upper page write are different from each other in accordance with the lower page data states. Therefore, the lower page data, which have already been written, are read out, and the upper page write will be controlled with reference to the lower page data.

Explaining in detail, in case the lower page data is "1" (i.e., data state E), write data "0" increases the threshold voltage to that of data state A while write data "1" keeps the cell at data state E. By contrast, in case the lower page data is "0" (i.e., data state B), write data "1" increases the threshold voltage to that of data state C while write data "0" keeps the cell at data state B.

Therefore, for example, data bit assignment of the lower page (LP) and upper page (UP) will be set as follows: (UP, LP)=(1, 1) in data state E; (UP, LP)=(0, 1) in date state A; (UP, LP)=(0, 0) in data state B; and (UP, LP)=(1, 0) in date state C.

In the reference cell R-cella, reference level R of about 0V will be written from the erase state (date state E) as similar to that in case of binary data storage scheme. At the write-verify time, verify-read is performed based on the cell current comparison between the information cell I-cell and reference cell R-cella.

Verify voltages used at data write times of data states A, B and C are PA, PB and PC, respectively while that applied to the reference cell R-cella is Pr. It is the same as in the above-described binary data write that data judgment is performed by comparing the cell current Ic of the information cell I-cell with the reference current Ir of the reference cell R-cella.

In the data bit assignment example shown in FIG. 16, the lower page read may be done once with read voltage RB while it is required of the upper page read to perform read operations twice with read voltages RA and RC. In this case, judgment of the upper page data may be performed with parity check, that is, even/odd judgment of the number of data "1". If the number of "1" is even, the upper page data is "1" while if the number of "1" is odd, it is "0".

Although, as described above, the lower page data read may be performed as well as the binary data read, the upper page data read is required of selecting one of to-be-increased threshold levels based on the lower page data which have already been written and externally input write data. Further, at write verify read time, it is necessary to judge which level is verified.

Figure 17:
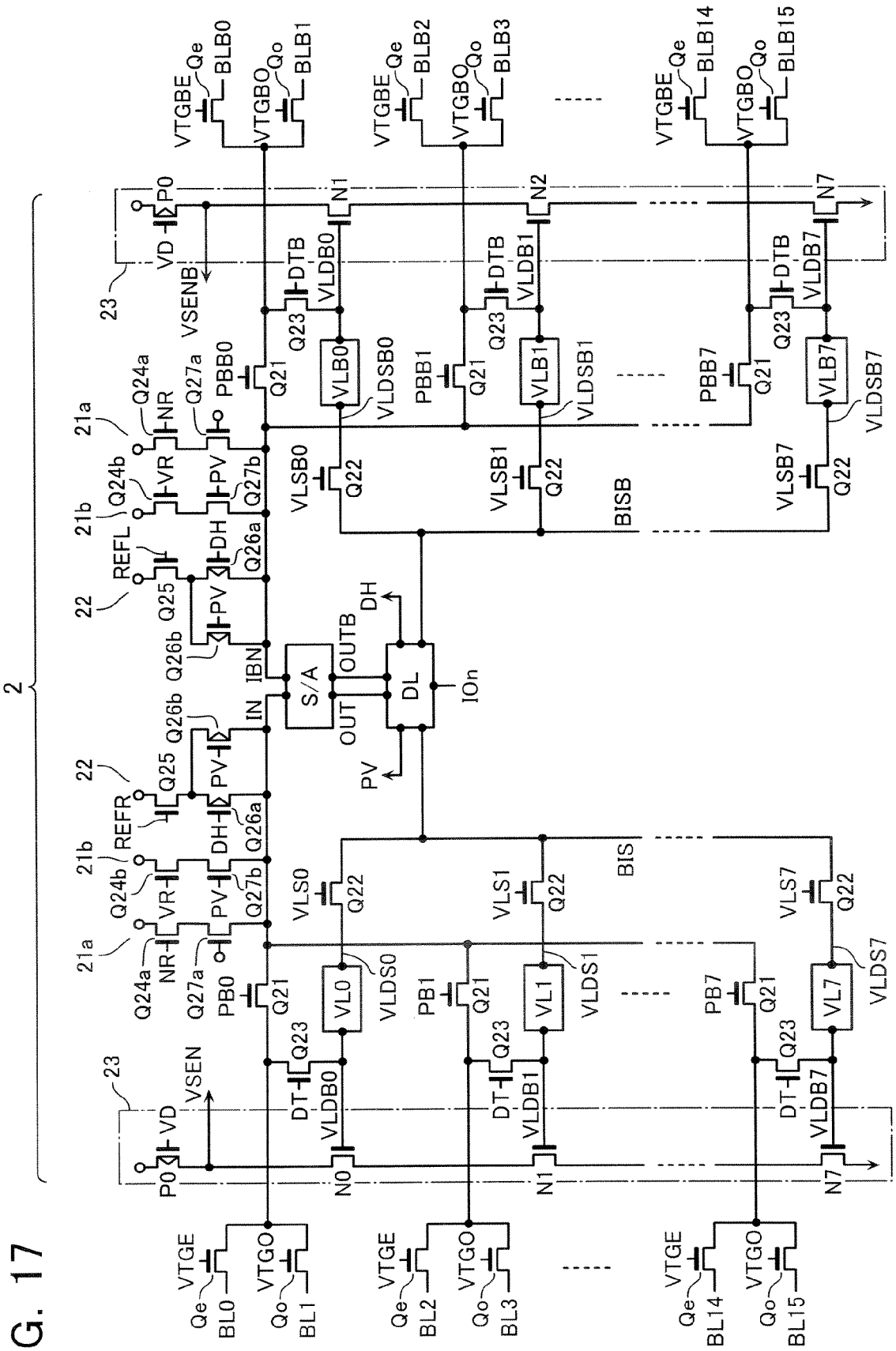
FIG. 17 shows the read/write circuit used in the four-level data storage scheme.

FIG. 17 shows the read/write circuit 2 adapted to the four-level data storage scheme, in which 16 bit line pairs share a sense amplifier S/A, in comparison with that adapted to the binary data storage scheme as shown in FIG. 9. The same portions as in FIG. 9 are referred to as the same reference symbols and the detailed explanation will be omitted.

Like the binary data storage scheme, a set of data latches VL, the number of which is the same as that of bit lines sharing a sense amplifier and simultaneously selected, is disposed on the bit line BL side. Similarly, a set of data latches VLB, the number of which is the same as that of bit lines sharing a sense amplifier and simultaneously selected, is disposed on the bit line BLB side. The data latch configuration also is the same as in the binary data storage scheme shown in FIG. 10.

Disposed at the input nodes IN and INB of the sense amplifier S/A are precharge circuits 21a and 21b, which are used independently at a normal data read time and at a write-verify time, respectively, as different from that in the binary data storage scheme. This is because that in case of four-level data storage scheme, it is in need of performing bit line precharge in accordance with to-be-written data at a verify-read time.

The normal read-use precharge circuit 21a has transistors Q24a and Q27a, which are connected in series and applied with a control signal NR and Vdd, respectively. The verify-read-use precharge circuit 21b has transistors Q24b and Q27b, which are connected in series and applied with a control signal VR and node PV, respectively.

Pull-up circuit (verify-control circuit) 22, which controls the sense amplifier state after sensing for the purpose of verify-controlling, also is different from that in the case of binary data storage scheme. In detail, this is formed of NMOS transistors Q25 driven by control signal REGR (or REFL) and parallel-connected PMOS transistors Q26a and Q26b driven by nodes PV and DH, respectively, which are connected in series. Transferred to the nodes PV and DH are write data.

Figure 18:
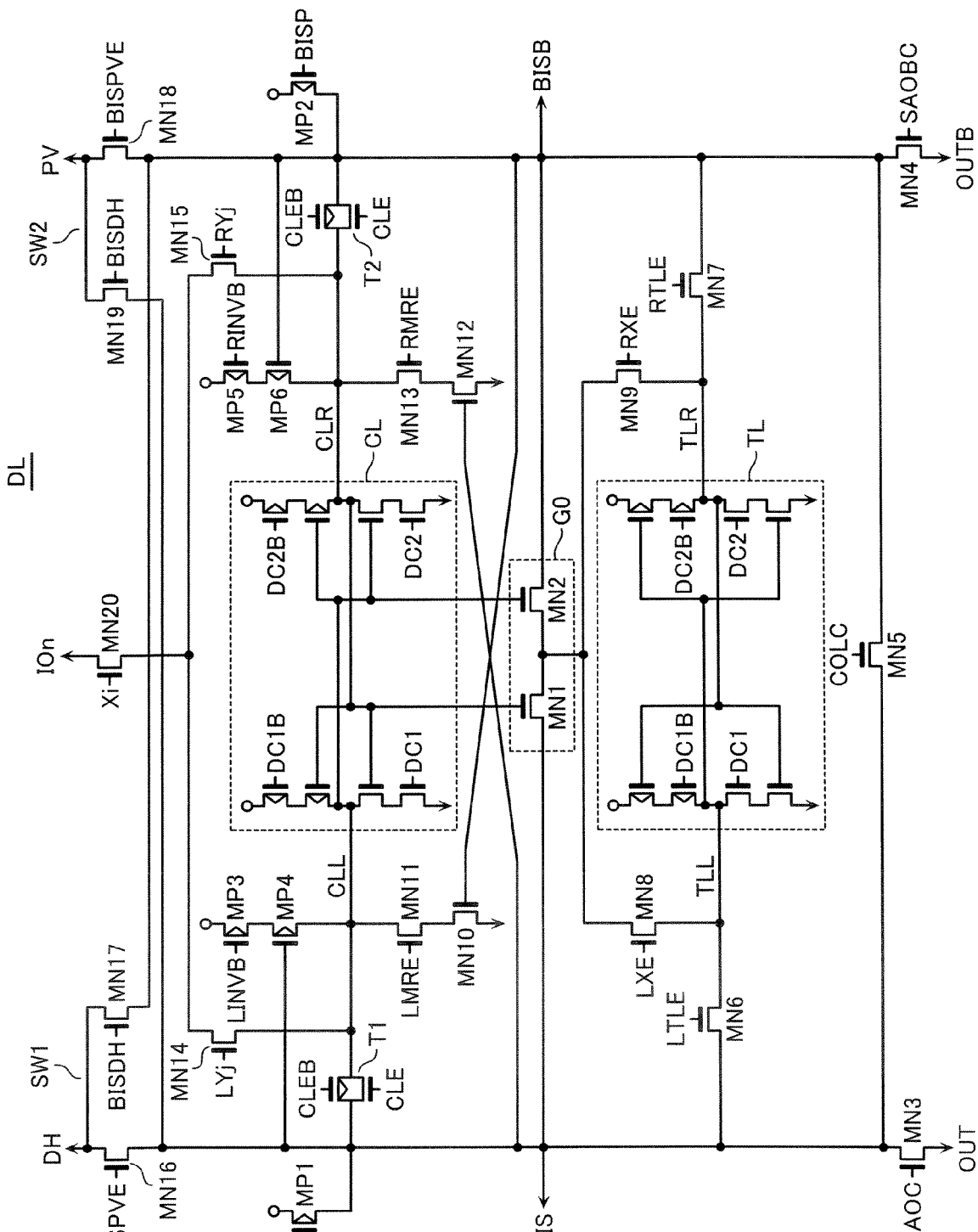
FIG. 18 shows the configuration of the transfer control circuit DL shown in FIG. 17.

Data transfer control circuit DL coupled to the sense amplifier S/A is required to do complicate data processing. Therefore, as shown in FIG. 18, the configuration is different from that shown in FIG. 11. That is, the transfer control circuit DL includes two latches circuits CL and TL with clocked CMOS inverters, which are selectively coupled to data transfer nodes BIS and BISB, for the purpose of data processing such as data inverting for verifying.

Data nodes CLL and CLR are coupled to data transfer nodes BIS and BISB via CMOS transfer gates T1 and T2, respectively. These data nodes CLL and CLR are also coupled to data line IOn via NMOS transistors MN14 and MN15 driven by LYj and RYj, respectively, and via NMOS transistor MN20 driven by Xi.

Data transfer nodes BIS and BISB are selectively coupled to output nodes OUT and OUTB via transfer NMOS transistors MN3 and MN4, respectively. To transfer data at nodes BIS and BISB as it is or with logic inverting if necessary, switch circuits SW1 and SW2 are disposed between data nodes BIS and BISB and node DH and PV, respectively.

Transistors MN1 and MN2 are disposed with a common drain, sources of which are coupled to data transfer nodes BIS and BISB, respectively, and gates of which are driven by data at data nodes CLR and CLL, respectively, of the latch circuit CL. These transistors MN1 and MN2 constitute an XOR gate for inverting data. The common drain is selectively coupled to data nodes TLL or TLR of data latch TL via transistor MN8 or MN9.

That is, at the portion of transistors MN1 and MN2, XOR operation is performed between data in the latch circuit CL and sensed data transferred to data transfer nodes BIS and BISB. The operation result will be transferred to and stored in data latch TL.

Next, write and read operations in accordance with four-level storage scheme will be explained in detail.

(Lower Page Write)

First, it will be explained the lower page (LP) write, which is performed as a data shift operation from the erase state E to data level B. Suppose that a set of information cells (i.e., one page) selected by even bit lines (BL0, BL2, . . . ) on the bit line BL side shown in FIG. 17 and a word line are written simultaneously.

Figure 19:
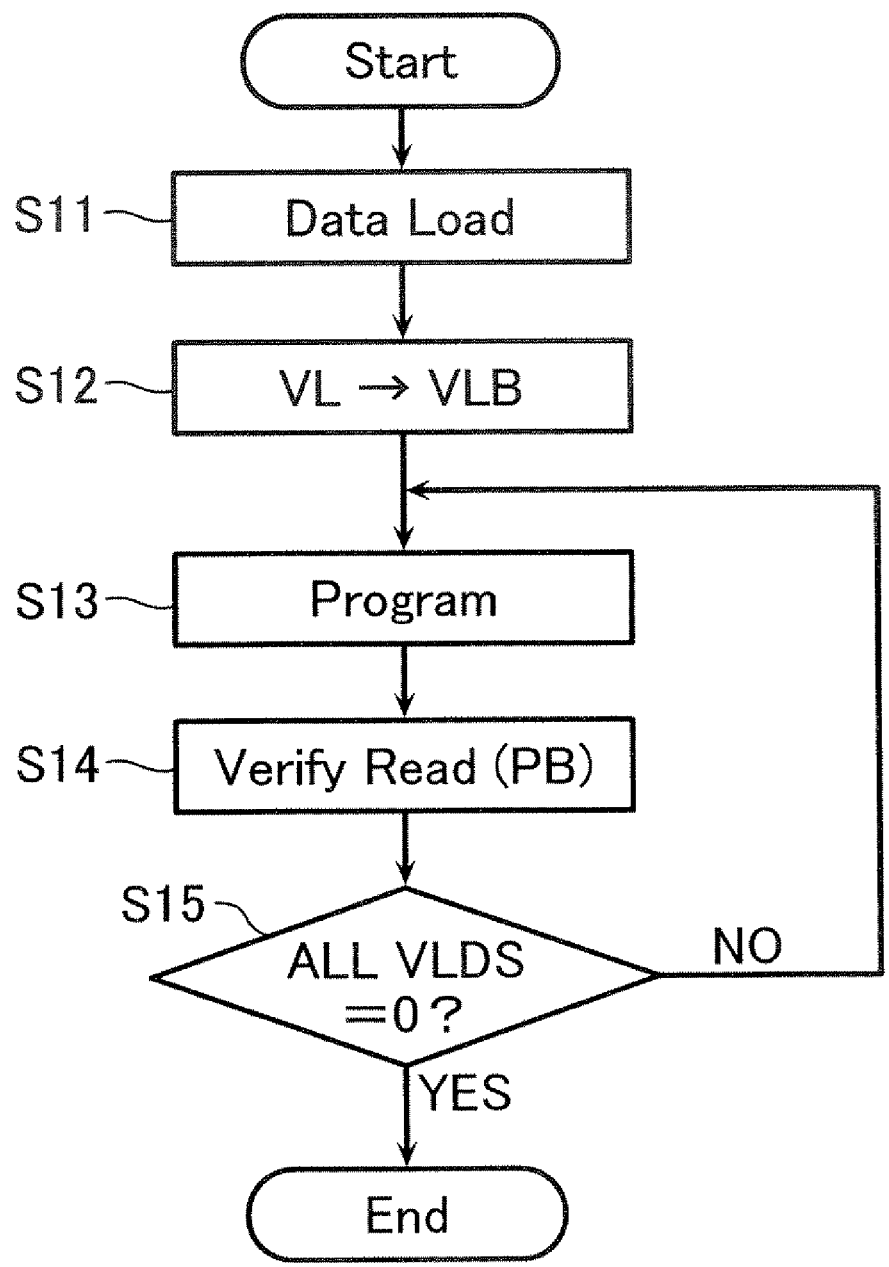
FIG. 19 shows the lower page write sequence.

FIG. 19 shows the lower page write flow. Following the command input, selected page address and data are input (step S11). In case of data write on the bit line BL side, write data are loaded in data latches VL, and then transferred to data latches VLB (step S12). Next, perform write voltage application to a selected word line (step S13). After having applied the write voltage, perform write-verify for verifying the write state (step S14).

Next, write completion will be judged by detecting whether data latches VL becomes in a sate of all "0" (i.e., VLDS="0") or not (step S15). If there is an insufficiently written cell, data write is repeated until all cells are written.

In case of "1" write, bit line is set as Vdd while in case of "0" write, it is applied with Vss. In FIG. 18, an initial state is as follows:
BISPVE=BISDH=LMRE=RMRE=CLE=LXE=RXE= LTLE=RTLE=COLC=SAOC=SA OBC=DC1=DC2=Xi=RYj=LYj="L"; and
LINVB=RINVB=CELEB=DC1B=DC2B=BISP="H".

External write data is loaded via data line IOn with Xi=RYi=CLE=VLS0=CLKB=DC1="H", and CLK=DC1B=CLEB="L". Therefore, the write data is inverted in the data latch CL and transferred via the transfer node BIS to be loaded in data latch VL.

That is, in case the externally supplied write data is "1", data in the data latch VL becomes as follows: VLDS="1"; and VLDB="0". While, in case of write "0", data in the data latch VL becomes as follows: VLDS="0"; and VLDB="1".

The above-described data load operation is repeated with signals VLS0-VLS7 sequentially selected in the rage of the sense amplifier S/A shown in FIG. 17, it is possible to load inverted data in data latches VL<7:0>. Similar data load operations are performed for multiple sense amplifiers simultaneously, a certain one page write data will be loaded.

After having loaded all write data, the write data in data latches VL are transferred to and loaded in data latches VLB. In detail, data transfer nodes BIS and BISB are short-circuited with COLC="H", and data in the latch VL is transferred to data latch VLB with VLS=VLSB="H".

Sequentially exchanging VLSB0-VLSB7, and VLS0-VLS7, the same data as those in data latches VL0-VL7 will be loaded in data latches VLB0-VLB7, respectively.

In case the information cells on the bit line side are written, write data in data latches VL serve as bit line control voltages at a write time. That is, in accordance with write data "1" and "0", VLDB=Vdd and Vss, and these are transferred to bit lines via transfer transistors Q23 and select transistors Qe. The write data in data latches VLB are kept as it is until the write completion is detected, and used for controlling bit line precharge at verify-read times.

Hereinafter, latched data in data latches VL and VLB will be defined by the data at nodes VLDS and VLDSB.

While data write is performed for the information cell coupled to the even numbered bit lines, odd numbered bit lines are non-selected and applied with Vdd for write-inhibiting. With respect to a selected block, the select gate line SGD on the bit line side is applied with Vdd; the select gate line SGS on the source line side with Vss; a selected word line with write voltage Vpgm (for example, 20V); and non-selected word lines with pass voltage Vpass (for example, 10V).

Under the bias condition, in case the bit line is set as 0V, the cell channel is 0V, so that write (i.e., electron injection) occurs with the write voltage Vpgm applied. By contrast, in case of the bit line is set at Vdd, the cell channel is boosted in potential by capacitive coupling, so that write is not performed.

In case the information cells on the bit line BLB side are written, external write data are inverted in the latch CL and transferred to data latches VLB, and the same data are transferred to data latches VL. Bit line voltage control is performed with write data in data latches VLB. The remaining processes are the same as those in case of bit line BL side selection.

(Lower Page Write-Verify)

Next, after having applied the write voltage, the information cells are subjected to verify-read. Verify-read is performed by current comparison between the selected information cell I-cell on the bit line BL side and the reference cell R-cella on the bit line BLB side. At this time, the selected word line of the information cell I-cell side is applied with verify voltage PB; and reference word line of the reference cell R-cella on the bit line BLB side with verify voltage Pr. Non-selected word lines are applied with read pass voltage.

Reference level R in the reference cell block R-cellaBLK being set about 0V like in the binary data storage scheme, pass voltage Vreadr on the reference cell block R-cellaBLK will be set sufficiently lower than the read pass voltage Vread used on the information cell block I-cellBLK (refer to FIG. 16).

If Ic>Ir as a result of comparing the cell current Ic of the information cell I-cell with the reference current Ir of the reference cell R-cella, data state B has been written while if Ic<Ir, data state E is kept as it is.

At an initial set time of the verify-read, input nodes IN and INB and output nodes OUT and OUTB of the sense amplifier S/A are set at Vss with ACCb=SEb="H", and ACC="L". In response to input address, bit line is selected. For example, bit line BL0 is selected at the verify-read time, a pair of bit lines BL0 and BLB0 are precharged with VTGE=VTGEB="H" (e.g., 5V), and PB0=PBB0=Vdd.

At a normal data read time, bit line precharge circuit 21a is used, and all bit lines are precharged equally. By contrast, at the verify-read time, precharge circuit 21b is used, which is controlled by precharge signal VR and data node PV.

This precharge operation with the precharge circuit 21b will be explained in detail below. Prior to the precharge, data in the data latches VLB0 and VL0 are transferred to data nodes PV and DH, respectively, with VLSB0=VLS0=BISVPE=Vdd+Vt.

In detail, data in the data latch VLB0 is transferred to data node BISB, and then transferred to node PV via transistor MN18 in the switch circuit SW2. While, data in the data latch VL0 is transferred to data node BIS, and then transferred to node DH via transistor M16 in the switch circuit SW1.

Therefore, when data of latch VLB0 is "1", the precharge circuit 21b is made active, thereby performing bit line precharge. By contrast, when data of latch VLB0 is "0", the precharge circuit 21b is kept off with PV="0", so that it does not perform bit line precharge.

As described above, it is not required of the bit line coupled to "1" write information cell (write inhibited cell), which corresponds to data "0" in data latch VLB, to be subjected to verify-read, and bit line precharge is not performed. As a result, it is able to reduce waste power consumption.

After the bit line precharge, the bit line is coupled to sense amplifier S/A with ACCb="L" and ACC="H", and then the sense amplifier S/A is activated with SEb="L" to amplify the cell current different between the input nodes IN and INB by positive feedback. As described above, if cell current Ic of the information cell I-cell is larger than the reference current Ir, OUT="H" is obtained while if not so, OUT="L" is obtained.

Therefore, when the threshold voltage of "0" write information cell becomes the data state B, the sense amplifier S/A outputs OUT="L"(=Vss). When the threshold voltage of "0" write information cell has not reached the data state B, OUT="H"(=Vdd) is obtained.

By contrast, when data in the data latch VL is "0", and the selected information cell is not written into "0" (i.e., in case of "1" write), the sense output OUT becomes "H". If this sensed data is transferred to data latch VL as it is, it serves "0" write in the following write cycle.

To deal with this undesirable situation, the pull-up circuit 22 on the bit line BL side will be activated as follows. That is, when the sense amplifier S/A starts to carry a current, apply signal REFR="H" to the pull-up circuit 22 on the bit line BL side. As a result, in case data transferred to the node DH is "0" (i.e., in case of "1" write), the pull-up circuit 22 is activated to be on, whereby current is supplied to the input node IN, and this results in that the output OUT is forcedly set at "L".

The sensed output data described above is transferred to data latch VL0 with VLS0=SAOC="H". At this time, data latch VL0 is set in a state of: CLKB="H", and CLK="L".

As a result of the above-described verify-read, the information cell, in which "0" write has been performed sufficiently, will be set in the "1" write state hereinafter while insufficiently "0" written information cell will be set in the "0" write state again. With respect to "1" write information cell, to set it in the "1" write state again, the write data in data latch VL0 is controlled in accordance with the sensed data.

The above-described verify read operations are sequentially performed for selected even bit lines (BL0, BL2, ...). That is, write and write-verify will be repeated until all to-be-written cells are written.

Verify-judgment is performed with the collective verify judgment circuits 23. If all cells have been written in certain data states after the write-verify, data latches VL designate the following state: VLDS<7:0>=Vss(="0"), VLDB<7:0>=Vdd (="1"). Therefore, if all selected information cells have been written, NMOS transistors N0-N7 are turned on to discharge the signal line VSEN, which has been precharged at Vdd. That is, write completion will be detected based on that the signal line VSEN is discharged to be Vss. If the signal line VSEN is not discharged, next write cycle is performed again.

In case of verify-reading the information cells on the bit line BLB side, to transfer data in data latches VL and VLB to nodes PV and DH, respectively, BISDH=Vdd+Vt is applied to the switch circuits SW1 and SW2. Further, since the selected information cell and reference cell are reverse coupled to the input nodes of the sense amplifier S/A, to activate the pill-up circuit 22 of the bit line BLB side, REFL="H" is set. IN addition, data of the output node OUTB of the sense amplifier S/A is transferred to data latch VLB.

The remaining processes are the same as the case where the information cells are selected on the bit line BL side.

(Upper Page Write)

Figure 20:
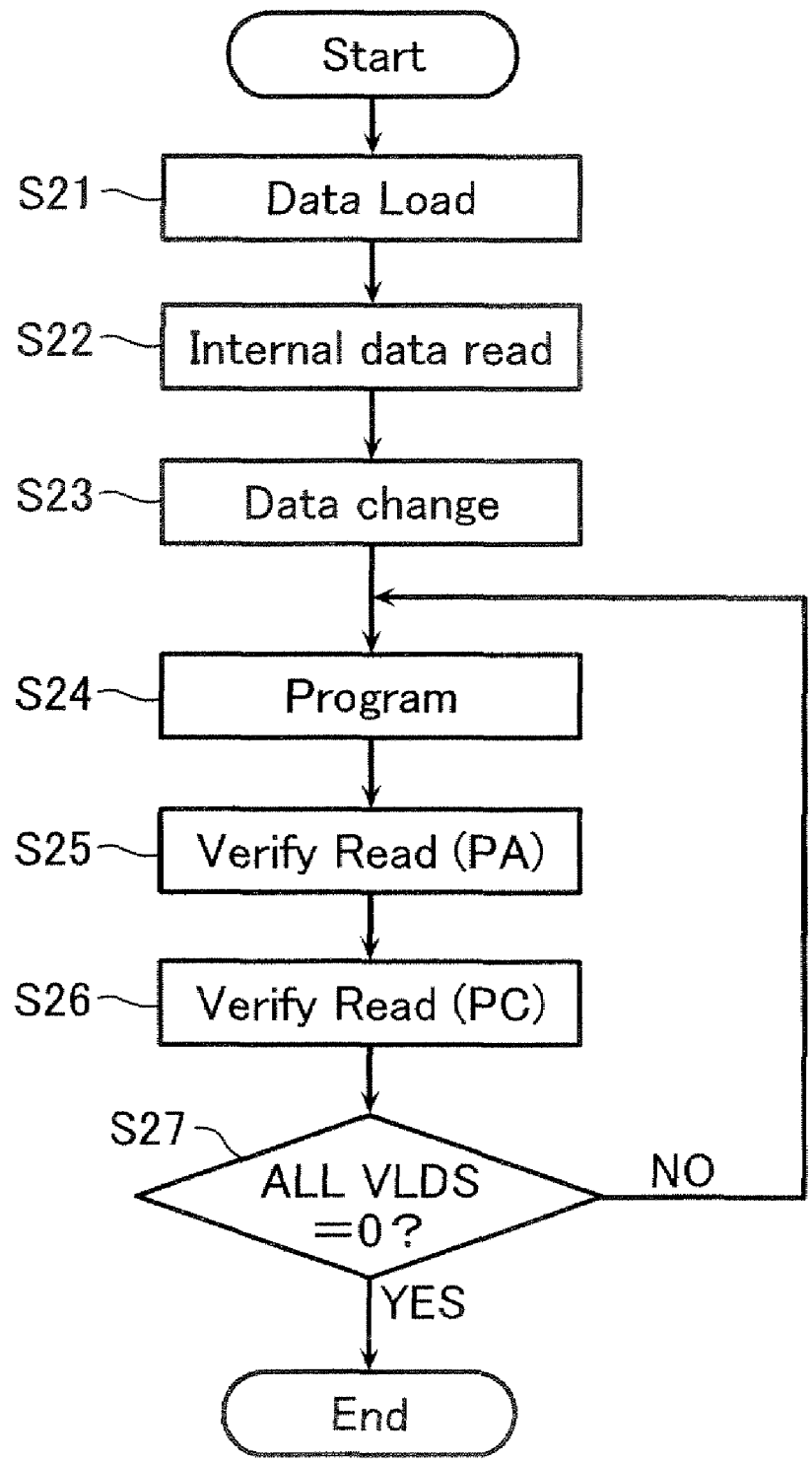
FIG. 20 shows the upper page write sequence.

Next, the upper page (UP) write will be explained below. FIG. 20 shows the upper page write flow. Following the command input, address and write data are input (step S21). Next, the lower page (LP) data are read out from the cell array because it is in need of referring to LP data in the UP data write mode (step S22).

The read out lower page data is subjected to a data change process for changing data in correspondence with the to-be-written upper page data (step S23).

Following it, write voltage application (step S24) and verify-read operations for verifying data levels A and C (steps S25 and S26) are sequentially performed. After verify-read, write completion judgment is performed (step S27). The write voltage application and write-verify are repeated until the write completion is detected.

FIG. 21 shows data state changes in data latches VL and VLB corresponding to write data level E, B, A and C in the write sequence of the upper page write for the information cells on the bit line BL side.

As different from the case of the lower page write, external write data is loaded in the data latch VLB as it is without inverting. Since it is required of the upper page write to refer to the lower page data, the lower page data will be read out from the cell array and loaded in the data latch VL. This is referred to as "internal data load (IDL)" hereinafter. The column of "IDL" in FIG. 21 shows data states in data latches VL and VLB in such a case that the read out data of the cell array is loaded in the data latch VL as it is.

As similar to the lower page write, data in the data latch VL is used for controlling a selected bit line. However, data in the data latch VL is not set at a suitable level just after the internal data load (IDL) shown in FIG. 21. Therefore, for the purpose of data write "PRG", necessary data level change is performed. In detail, when the read out data is transferred to data latch VL, it will be subjected to a certain data processing.

Explaining in detail more, in case of data level E write without threshold changing, it is in need of setting the bit line BL at Vdd. In this case, it is required of the data latch VL to store data "0". In case of writing data level C, bit line BL is to be set at 0V because it is required to cause cell's threshold shift. In this case, data latch VL is to store data "1".

The column "PRG" in FIG. 21 shows that the data state in the latch VL is changed with respect to data levels E and C. This data change processes will be performed by logic operations with XOR gate GO formed of NMOS transistors MN1 and MN2 in the data transfer control circuit DL. The details will be explained below.

The internal data load is performed with a normal data read mode without regard to the write data in the data latch VLB. At this time, bit line precharge is performed by the precharge circuit 21a while the pracharge circuit 21b and pull-up circuit 22 are kept off.

A selected word line on the selected information cell side is applied with read voltage RB shown in FIG. 16 while a selected reference word line of the reference cell side is applied with read voltage Rr. With this bias, data states E and B of the information cells are read out to the respective bit lines, and sensed sequentially at the sense amplifier S/A like the normal data read operation.

Data sense result of the bit line BL0 is required to be inverted if necessary and transferred to data latch VL0 in accordance with data in data latch VLB0. For this purpose, prior to the data sense operation, data in data latch VLB0 is transferred to latch CL in the transfer control circuit DL with VLSB0=CLE="H", and CLEB="L". Further, the node TLR of data latch TL is charged-up via PMOS transistor MP2 with BISP="L", and RTLE="H" to be set in a state of: TLR="H", and TLL="L".

Thereafter, bit line precharge is performed, and then sensed data is transferred to data nodes BIS and BISB with SAOC=SAOBC="H". That is, the output nodes OUT and OUTB are coupled to data nodes BIS and BISB, respectively.

As a result, XOR logic operation is performed with MNOS transistors MN1 and MN2 between data in data latch CL (i.e., data of data latch VLB0) and the sensed data. For example, in case of VLB0="1", the sensed data is inverted and transferred to data latch VL0.

The XOR logic operation will be further explained in detail. In case data in data latch VLB0 is "1", NMOS transistor MN1 is turned on based on data in data latch CL. At this time, if read out data is "0" (i.e., OUT="L", and BIS="L"), node TLR of data latch TL will be discharged to be "L" via NMOS transistor MN1 when RXE="H" is applied. This being stored in data latch TL, and then transferred to data latch VL0, data in the data latch VL0 becomes "1". With this data process, as shown in FIG. 21, data in the data latch VL0 is inverted in case of cell data C. In case of cell data B, there is no data inverting.

By contrast, in case data in data latch VLB0 is "0", MNOS transistor MN2 is turned on. At this time, if read out data is "1" (i.e., OUTB="L", and BISB="L"), node TLR of data latch TL will be discharged to be "L" via NMOS transistor MN2 when RXE="H" is applied. This being stored in data latch TL, and then transferred to data latch VL0, data in the data latch VL0 becomes "1". That is, as shown in FIG. 21, data in data latch VL0 becomes "1" in case of cell data A, and becomes "0", that is inverted one of read out data, in case of cell data E.

Through the above-described data inverting process, the data state will be obtained at the write time "PRG" shown in FIG. 21. Thereafter, the connection between output nodes OUT, OUTB and data nodes BIS, BISB is made off with SAOC=SAOBC="L".

The above-described operation being sequentially repeated for all selected bit lines (BL0, BL2, . . . ), write data initial setting is performed for the set of data latches VL corresponding to one page.

Next, data write will performed in accordance with the write data set in data latched VL. That is, selected bit lines are applied with Vdd or Vss in accordance with write data in the respective data latches VL, thereby controlling the potential of the respective NAND cell channels; and write voltage Vpgm is applied to the selected word line.

In case of the information cell write on the bit line BLB side, external write data are loaded in data latches VL, and logic operation results for read out data are transferred to data latches VLB. Data in the latches VLB are used for bit line voltage controlling. After the logic operation, LXE, LTXE are driven in place of RXE, RTLE. The others are the same as in the above-described data write for the information cells on the bit line BL side.

(Upper Page Write-Verify)

Upper page write-verify includes A-level verify (AV) and C-level verify (CV) for verifying data states A and C, respectively, shown in FIG. 16. At the verify-read time, verify voltages PA and PC, and Pr are used for the corresponding information cells, and the reference cell, respectively, as shown in FIG. 16, and current comparison is performed.

To do verify-read, it takes l00ns as a sensing time and several μs for word line level charging. Therefore, it is desired to use a driving method for achieving a high-speed property.

Figure 22:
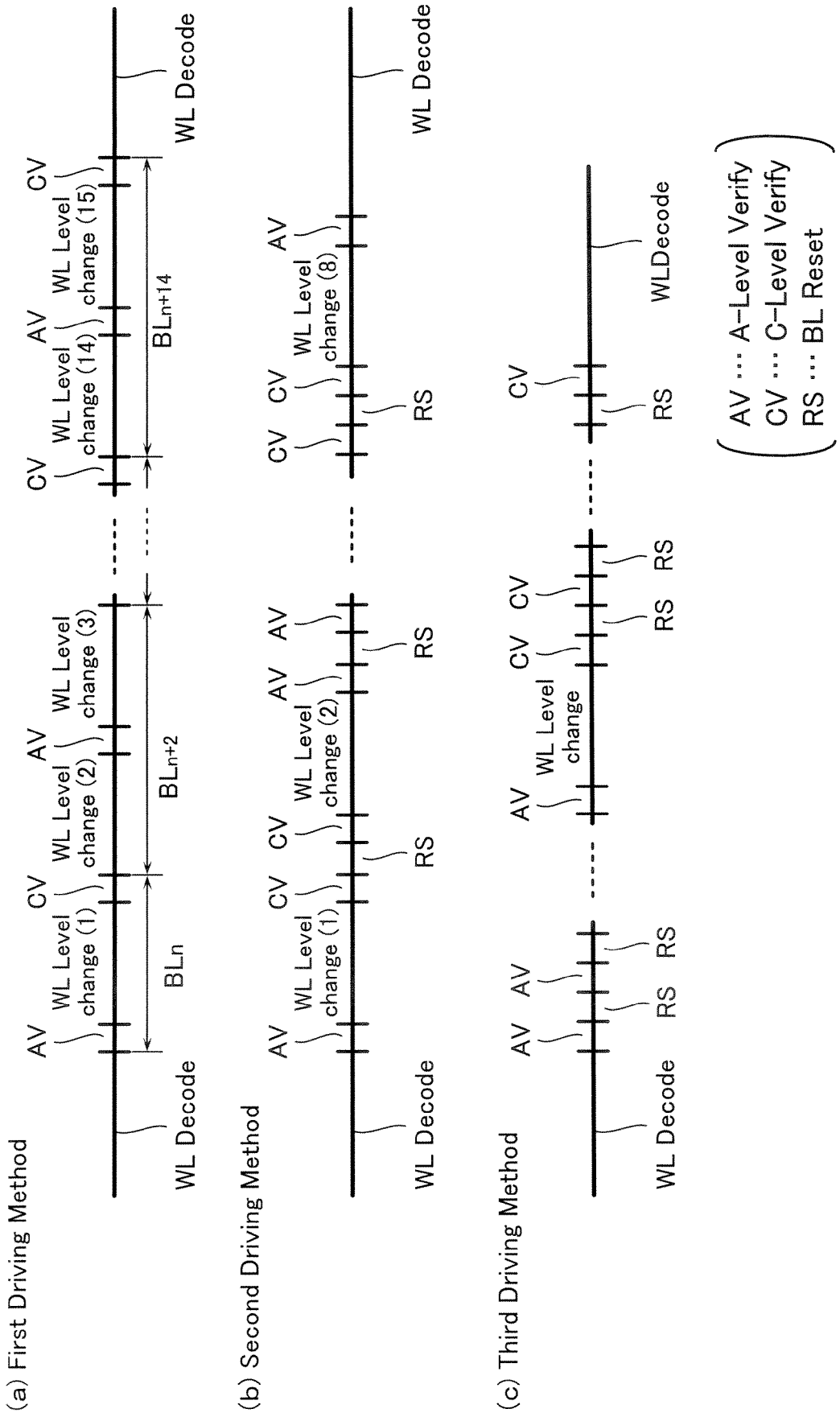
FIG. 22 is a diagram for explaining the verify-read and word line level change scheme in the upper page write mode.

In detail, as shown in FIG. 22, there are three verify-read use word line drive methods as follows:

(a) the first driving method: exchange the word line level for each A-level verify (AV) and C-level verify (CV). With this scheme, it is in need of exchanging word lines voltage 15 times for verifying all bit lines.

(b) the second driving method: do AVs two times without exchanging the word line level, and similarly do CVs two times without exchanging the word line level, and exchange the word line level between two AVs and two CVs. Note here that, in this case, it is in need of resetting the bit line between two AVs and between two CVs. With this scheme, the word line level should be changed 8 times.

(c) the third driving method: do AVs for all bit lines without exchanging the word line level; then change the word line level; and do CVs for all bit lines without exchanging the word line level. With this method, since the word line level change is only one time, it is possible to perform at the most highest rate.

In this embodiment, the above-described third driving method is used.

The upper page verify-read is basically performed by use of data in the data latches VL and VLB as well as the lower page verify-read. However, it will be used here such a condition that verify-read is performed only when data in the data latch VLB is "1".

When the upper page write has been finished, data state of data latch VLB is shown in the column "PRG" in FIG. 21. This data in latch VLB may be used for C-level verifying as it is while it is in need of inverting the data for A-level verifying.

The data inverting operation for inverting data in the data latch VLB is performed by use of data latch CL in the transfer control circuit DL as follows. Initially, turn on PMOS transistor MP1 and MNOS transistors MN12, MN13 with BISP="L" and RMRE-"H", thereby setting the node CLR of data latch CL to be "L".

Next, transfer data of data latch VLB to node BISB with VLSB="H", and at the same time, make RINVB "H". If data of latch VLB is "1" (BISB="H"), PMOS transistor MP6 is kept on; and node CLR is kept at "0". By contrast, if data of latch VLB is "0", PMOS transistors MP5 and MP6 are turned on, whereby node CLR is charged-up to be "1".

After having stored this data in data latch CL, transfer it to data latch VLB via transfer gate T2 and via data node BISB. As a result, as shown in the "A-level verify" column in FIG. 21, the write data in data latch VLB is inverted.

The above-described data inverting operation will be repeated sequentially for eight data latches VLB0-VLB7 per one sense amplifier S/A.

Next, A-level verify will be explained below. Initially, data in data latch VL is transferred to data latch CL. Following it data in data latches VL and VLB are transferred to nodes BIS and BISB, respectively, and then the transferred data are supplied to verify control-use nodes DH and PV with BISPVE="H", respectively.

In case of PV="1" (i.e., VLB="1"), verify-use precharge circuit 21b is turned on with VR="H" in FIG. 17 to precharge bit lines. If PV="0", bit lines are not precharged, so that verify-read is not performed.

Further, at A-level verify time, in case of VLB="0" (i.e., write of data states E and C) and VL="0" (i.e., write of data states E and B), the sense amplifier S/A is forcedly set at OUT="L". In case bit line BL side is selected, this is based on the pull-up circuit 22 on the bit line BL side. That is, In case of PV="0" or DH="0", when signal REFR="H" is applied, the pull-up circuit 22 on the bit line BL side is turned on to supply current to the input node IN, thereby causing OUT="0".

Therefore, only in case of PV=DH="1" (i.e., only at data level A write time), verify-read is performed as usual. The threshold voltage of the selected information cell on the bit line BL side is increased to a desired level, and the cell current becomes smaller than the reference current, it is provided OUT="L", while the others become OUT="H". In FIG. 21, it is shown "RD" in the data latch VL in the column of A-level verify. This designates that data (RD) becomes "0" or "1" in response to the result of verify-read.

To normally transfer the verify-read data to data latch VL, it is required of data held in data latch CL, which is one stored in data latch VL, to be set again. This is done with LMRE="H". If BISB="1", NMOS transistors MN10 and MN11 are turned on, so that the node CLL is set at "L". In case of BISB="0" (i.e., verify-read is not performed), data in data latch CL is kept as it is.

In case of VLB="0", the sense amplifier output becomes OUT="L". Therefore, even if the sensed data OUT="L" is transferred to node BIS, and RMRE is set at "H", data latch CL will not be changed. Therefore, data transferred to latch CL from latch VL is kept as it is.

In case of VLB="1", as described above, the node CLL of data latch CL is forcedly set at "L". Further, if, as a result of verify-read, the sense amplifier output is OUT="H", when this data is transferred to node BIS, and RMRE is set at "H", data in data latch CL is inverted in logic. If OUT="L", such data inverting does not occur. Therefore, in case of VLB="1", data in data latch CL will set again in response to the sensed result of verify-read.

Data in latch CL is transferred to latch VL, resulting in that one verify-read is completed.

As shown in FIG. 22(c), the above-described A-level verify-read is repeatedly performed for all selected bit lines.

Next, C-level verify is performed. Note here that the order of A-level verify and C-level verify does not matter. As described above, in the A-level verify mode, data in data latch VLB is inverted. Therefore, if A-level verify is performed in advance, in the following C-level verify mode, it is necessary to invert data in data latch VLB again. If C-level-verify is performed in advance, data in data latch VLB used at the write time "PRG" may be used as it is.

The basic operation of C-level verify-read is the same as A-level verify-read. That is, data in data latch VL is transferred to data latch CL in the transfer control circuit DL. As a result of verify-read, it will be defined in accordance with data in data latch VLB whether data in data latch CL is kept as it is or set at the same level as the sensed output.

Further, in the C-level verify mode, as shown in FIG. 21, E-level write cell is subjected to verify-read with VLB="1". At this time, the verify control-use pull-up circuit 22 forcedly sets the sense amplifier at OUT="L". That is, with respect to E-level write cell, data of VL="0" is transferred to node DH via node BIS, and pull-up circuit 22 on the bit line BL side is turned on with REFR="H", thereby setting OUT="L".

In case of VLB="0" too, OUT="L" is forcedly set.

As described above, only in case of VLB="1" and VL="1". (i.e., only in case of C-level verify), verify-read is performed as normal, and data latch CL will be set in accordance with the sensed result.

Data in data latch CL is transferred to data latch VL. The above-described C-level verify-read is repeatedly performed for all selected bit lines.

After having finished each cycle of write, A-level verify and C-level verify, collective verify-judgment circuit 23 performs verify-judgment. With respect to an information cell to be written into E or B level, after the internal data read, VL="1" (i.e., VLDB=Vdd) will be set. Therefore, when data write for all selected information cells has been completed, it is obtained VLDB<7:0>=Vdd.

Therefore, after all data write completion, the signal line VSEN, which has been precharged to Vdd, is discharged to be at VSEN="L". As a result, write completion may be detected. If VSEN="L" is not obtained as a result of the collective verify-judgment, the write cycle will be successively performed.

With respect to the write-verify for information cells on the bit line BLB side, the coupling state of the information cell and reference cell to the sense amplifier is reversed to that in the write-verify mode for information cells on the bit line BL side, and the operation of data latches VL and VLB also be reversed. Therefore, when data in data latches VLB and VL are transferred to nodes DH and PV, respectively, the switch circuits SW1 and SW2 are activated with BISDH="H" in place of BISPVE. Further, LMRE, LINVB and LME are used in place of RMRE, RINVB and RME, respectively. The others are the same as the case of write-verify for cells on the bit line BL side.

(Lower Page Read)

The lower page read is performed with read voltages RB and Rr shown in FIG. 16 in such a manner that data states E and A are read as data "1"; and data states B and C as data "0". This is the same as in the binary data storage scheme.

Suppose here that the arrangement of the cell arrays and sense amplifier circuit is the same as in the binary data storage scheme explained with reference to FIG. 14. To do high-speed read, it is desirable to use data latches VL and VLB as caches as well as in the case of the binary data storage scheme.

For example, in case even numbered bit lines are selected on the bit line BL side, while a selected word line is kept in level as it is, the sensed data of bit lines BL0, BL2, ..., BL14 are sequentially transferred to data latches VL0, VL1, ..., VL7, respectively.

Like as explained with respect to FIG. 15, while the lower page data are sensed from the cell array 1t to be cached in data latches VL, and output with column selections other lower page data in the cell array 1c may be cached in data latches VLB. As a result, it is possible to make the word line selection time minimum, and it will be achieved a burst read operation without breaking.

In case read of the cell array 1t is followed by read of the cell array 1t, it is used such a data transfer control that the former sensed data are cached in data latches VL; and the latter in data latches VLB. In this case, the sensed data at the output node OUTB sensed from the bit line BL side being transferred to data latch VLB, it will be reversed to that in the case where data is transferred to data latch VL.

Therefore, to output data in data latch VLB, it is necessary to invert data at the data inverting circuit 83 shown in FIG. 11 and disposed on the data line IOn with INVD="H" and INVB="L". If it is not necessary to invert data, INVD="L", and INVB="H" are applied, whereby data is output as it is without inverting.

To avoid data collision between data transferring from the output node OUTB of the sense amplifier to data latch VLB and that from data latch VL to data line IOn, it is effective to deal with such a data transfer control method as follows. In place of the data output scheme of 30 ns cycle with the internal bus width of 16I/Os, it is prepared such a data output scheme that read cycle is 60 ns with the internal bus width of 32 I/Os. In this case, divide 60 ns into two periods, and transfer data with time sharing between data transfer from the sense amplifier to data latch VLB and that from data latch VL to data line IOn.

As a result, it becomes possible to avoid data collision.

In case the internal bus width is made large, it is preferred to dispose data latches behind the data I/O pads. This makes a data transferring mode adaptable, in which the number of data bits transferred on the internal bus is larger than that of I/O pads.

(Upper Page Read)

Upper page read is performed with: twice data sense operations with read voltages RA and RC shown in FIG. 16; and parity check for the number of "1" data obtained through the twice data sensing operations. The order of the twice sense operations does not matter. If the number of "1" data is even, the upper page is UP="1" while if it is odd, UP="0".

In the upper page read operation, it is also desired to make the word line level transition less as possible. For this purpose, for example, when a selected word line and even numbered bit lines on the bit line side are selected, data sense with read voltage RA is repeated sequentially for bit lines (BL0, BL2, . . . ), and the sensed data are transferred to and held in data latches (VL0, VL1, . . . ) Next, the selected word line level is changed to read voltage RC, and then the same data sense operations are performed for bit lines (BL0, BL2, . . . ) as described above These sensed data are subjected to a certain logic operation, so that the upper page data may be sequentially decided.

A detailed example will be explained for such a case that information cells and reference cells are selected on the bit line BL side and BLB side, respectively. Word line levels on the information cell side and reference cell side are set at the read voltages RA and Rr, respectively. After precharging bit line BL0 with precharge circuit 21a, data sense is performed. Following it the sensed data at the output node OUT is transferred to node BIS, and then transferred to data latch VL0.

Similarly, data sense is performed for the next bit line BL2, and the sensed data is transferred to data latch VL1. These data sensing and transferring are repeatedly performed for all selected bit lines.

Next, the selected word line level is changed to read voltage RC, and data sense is continued. Prior to this data sense, data in data latch VL is transferred to data latch CL in the transfer control circuit DL, and then node TLR of data latch TL is set at "H" via PMOS transistor MP2 and NMOS transistor MN7, which are turned on in response to BISP="L" and RTLE="H", respectively. This is for executing parity check based on XOR logic between the sensed result held in data latch VL and the following sensed result in the transfer control circuit DL.

After bit line precharging and data sensing, the sensed result is transferred to nodes BIS and BISB with SAOC=SAOBC="H" . Based on the sensed data and data in data latch CL, XOR logic operation is performed with MNOS transistors MN1 and MN2. That is, RXE="H" being applied, it will be detected whether node TLR of data latch TL, which is set at "H", is discharged or not via MNOS transistors MN1 or MN2. As a result, XOR logic operation result is held in data latch TL.

The details will be explained as follows. The last sense data has been transferred to data latch CL from data latch VL. Supposing, for example, that the last data is CLL="H"(="1"), and the present sense data transferred from OUT to BIS is "H"(="1"), MNOS transistor MN1 is turned on, but node TLR of data latch TL is kept at "H". Further, in case the last data is CLL="L", and the present sense data is BIS="L", MNOS transistor MN2 is turned on, but node TLR of data latch TL is also kept at "H".

By contrast, in case the last sense data is CLL="H" and the present sense data is BIS="L", and in case the last sense data is CLL="L" and the present sense data is BIS="H", node TLR of data latch TL will be discharged via NMOS transistors MN1 and MN2, respectively.

As a result, parity checking operation of "1" data numbers is performed, and upper page data will be read out. The read data at node TLR in data latch TL is transferred to data latch VL.

The above-described data sense and logic operation for the last sense data and the present sense data are repeatedly performed for the selected bit lines (BL0, BL2, . . . ), and the results are transferred to data latches (VL0, VL1, . . . ).

In case information cells on the bit lien BLB side are selected, the same upper page read as described above will be performed except that data latches VLB are used in place of data latches VL, and data process in the transfer control circuit DL is performed by use of the reverse nodes of data latches CL and TL.

When the read data in data latch VL is output to the external, VLS=CLE=Xi=LYj="H", and CLEB="L" are set. Supposing that data line IOn has been initially set at Vdd, it is kept as it is when data in data latch VL is Vdd; and it is discharged when data is 0V. As a result read data will be output.

When outputting the read data in data latch VLB, RYi is set at "H" in place of LYj.

Other Embodiments

Other embodiments for 4-level storage scheme will be explained below.

As explained with reference to FIGS. 16 and 20, data states A and C are simultaneously written in the upper page write cycle. In this case, it may be often generated a situation as follows: since data state C has a higher threshold level than data state A, data write for data state C has not finished in spite of that data write for data state A has been finished.

In the above described embodiment, the collective verify-judgment circuit 23 in FIG. 17 is so configured that when all cells to be written into data states A and C have been written, "write completion" is detected. That is, if data write for data state C has not been finished, even if data state A has been written, A-level verify is performed.

By contrast, in case data write for data state A has been finished while data write for data state C has not been finished, it will be possible to make the whole write time short by use of such a method that only C-level verify is continued.

Figure 23:
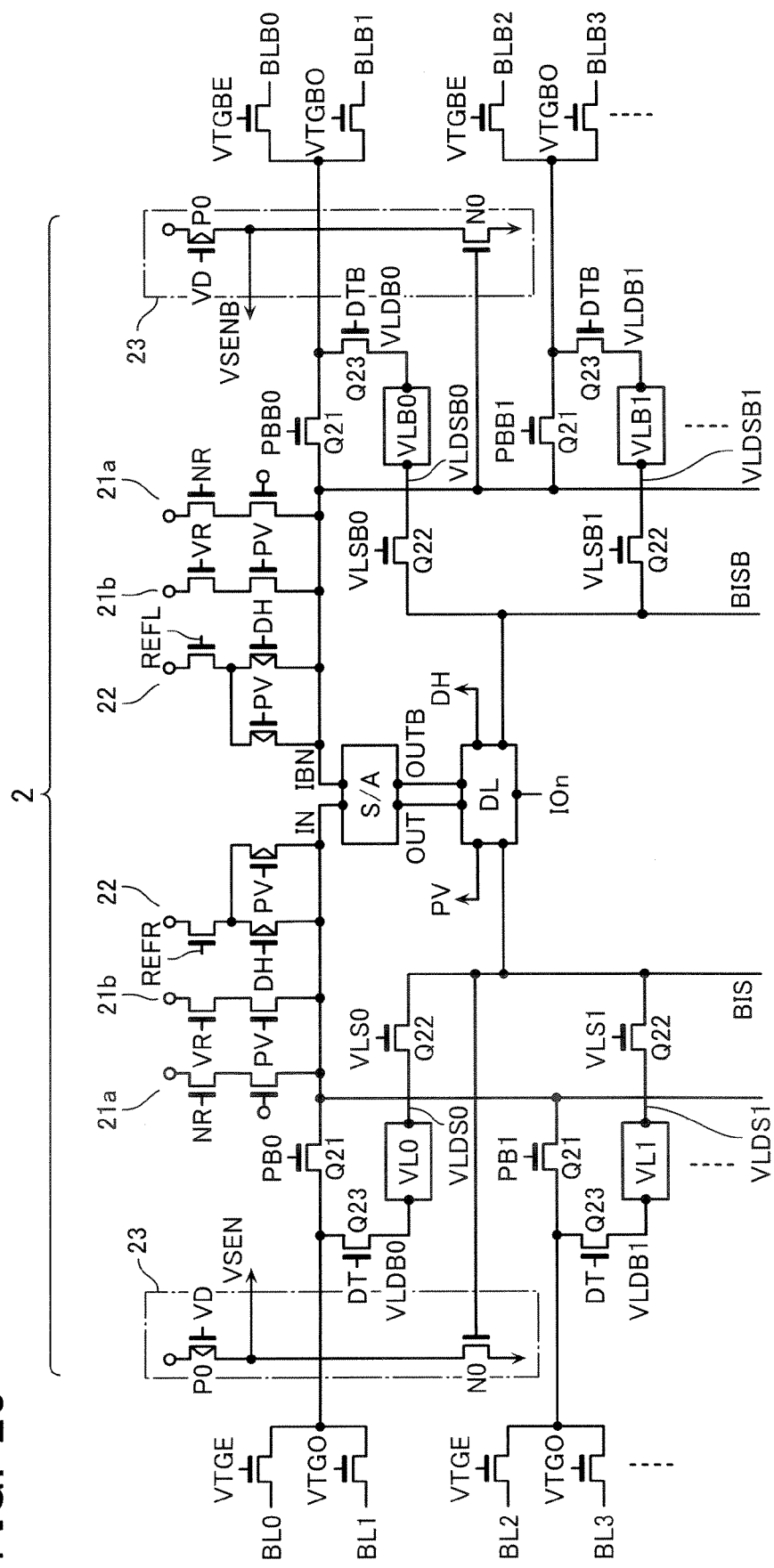
FIG. 23 shows the read/write circuit, with which verify-read may be controlled for each verify level, in accordance with another embodiment.

In consideration of this, in another embodiment, the collective verify-judgment circuit 23 is so configured as to be able to do verify-judgment for each column or for each write level as shown in FIG. 23 in place of FIG. 17. In detail, data transfer nodes BIS and BISB are common nodes between the sense amplifier S/A disposed for each 16 bit line pairs and eight data latches VL and VLB each disposed for 16 bit lines. In this embodiment, the collective verify-judgment circuit 23 has only one judging-use NMOS transistor NO, the gate of which is coupled to node BIS (or BISB).

Suppose, as described above, that one sense amplifier S/A is disposed for 8 bit line pairs simultaneously selected, and eight times A-level verify operations and eight times C-level verify operations are performed in one write cycle. The sensed results of the eight A-level verifies at node OUT (or OUTB) are sequentially transferred to data latches VL0-VL7 (or VLB0-VLB7) via data node BIS (or BISB).

At each verify-read time, let the verify-judgment circuit 23 judge "H" or "L" of the node BIS (or BISB). The precharged signal line VSEN (or VSENB) of the circuit 23 will be discharged when data node BIS (or BISB) is "H" (incomplete write) while it will be kept in level as it is when data node BIS (or BISB) is "L" (complete write).

Figure 24A:
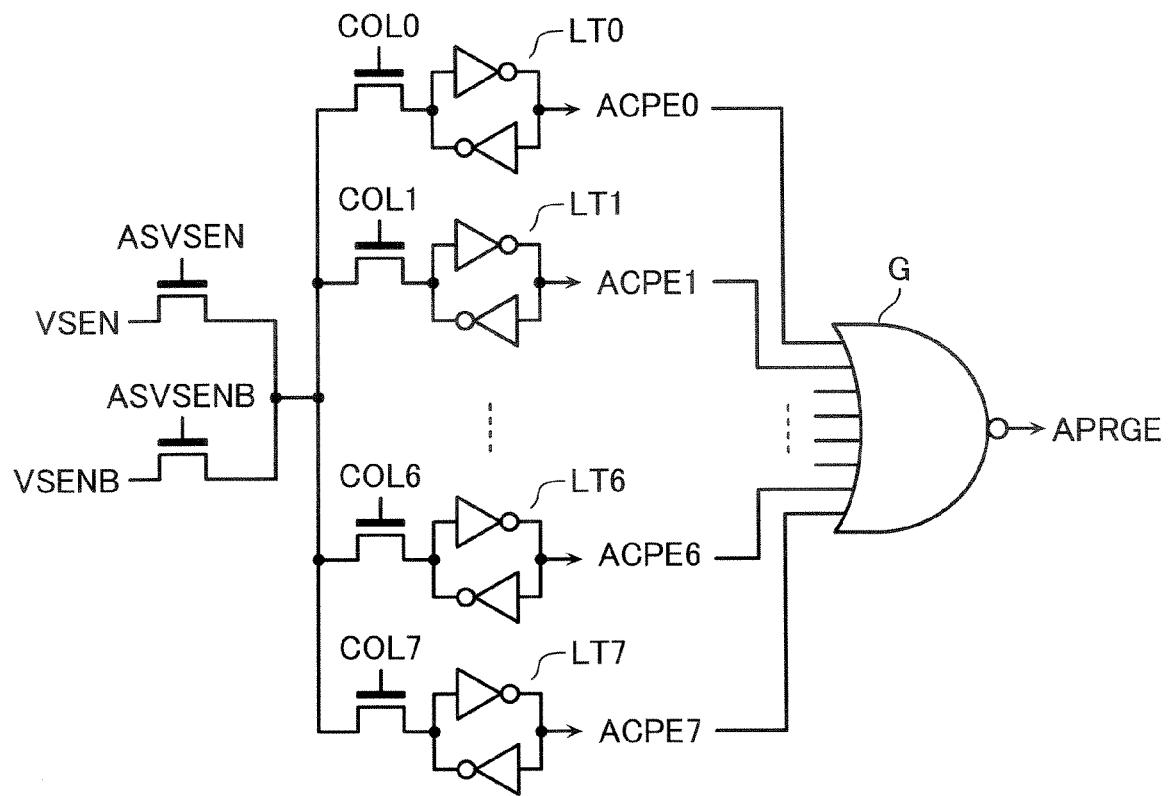
FIGS. 24A and 24B show the verify-judgment circuits used for outputting verify-judgment result for each column at A-level verify time and C-level verify time, respectively.
Figure 24B:
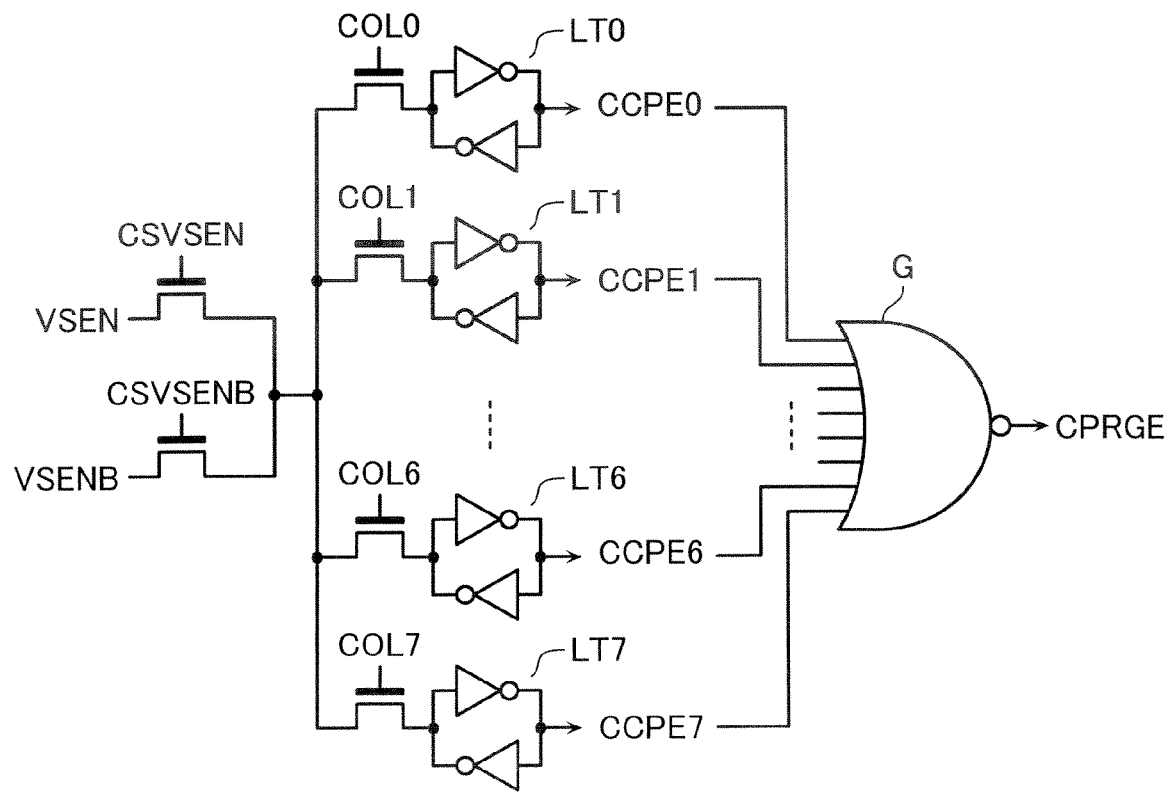

At A-level verify-read times, the judgment results for the signal line VSEN (or VSENB) are sequentially transferred to eight data latches LT0-LT7 shown in FIG. 24A while at C-level verify-read times, the judgment results for the signal line VSEN (or VSENB) are sequentially transferred to eight data latches LT0-LT7 shown in FIG. 24B.

That is, in the case shown in FIG. 24A, the judging results for the signal line VSEN (or VSENB) are selected by signals ASVSEN (or ASVSENB) generated at the A-level verify times, and then selected by column select signals COL0-COL7 to be latched in data latches LT0-LT7.

Similarly, in the case shown in FIG. 24B, the judging results for the signal line VSEN (or VSENB) are selected by signals CSVSEN (or CSVSENB) generated at the C-level verify times, and then selected by column select signals COL0-COL7 to be latched in data latches LT0-LT7.

Outputs ACPE0-ACPE7 and CCPE0-CCPE7 of data latches LT0-LT7 shown in FIGS. 24A and 24B are subjected to NOR logic operations, and the judged results are output to nodes APRGE and CPRGE, respectively.

Therefore, the results of eight A-level verify operations are held in data latches LT0-LT7 shown in FIG. 24A. If all of them is pass (i.e., ACPE0-7="L"), there is generated APRGE="H". Similarly, the results of eight C-level verify operations are held in data latches LT0-LT7 shown in FIG. 24B. If all of them is pass (i.e., CCPE0-7="L"), there is generated CPRGE="H". As described above, it is possible to control the A-level verify and C-level verify independently of each other.

There has already been provided in the NAND-type flash memory such a method that to make the data threshold distribution small at a write time, a medium voltage is applied to a bit line. It will be determined based on the verify-read result whether a bit line coupled to a cell is set at 0V or the medium voltage. This method is effective in the present invention.

Figure 25:
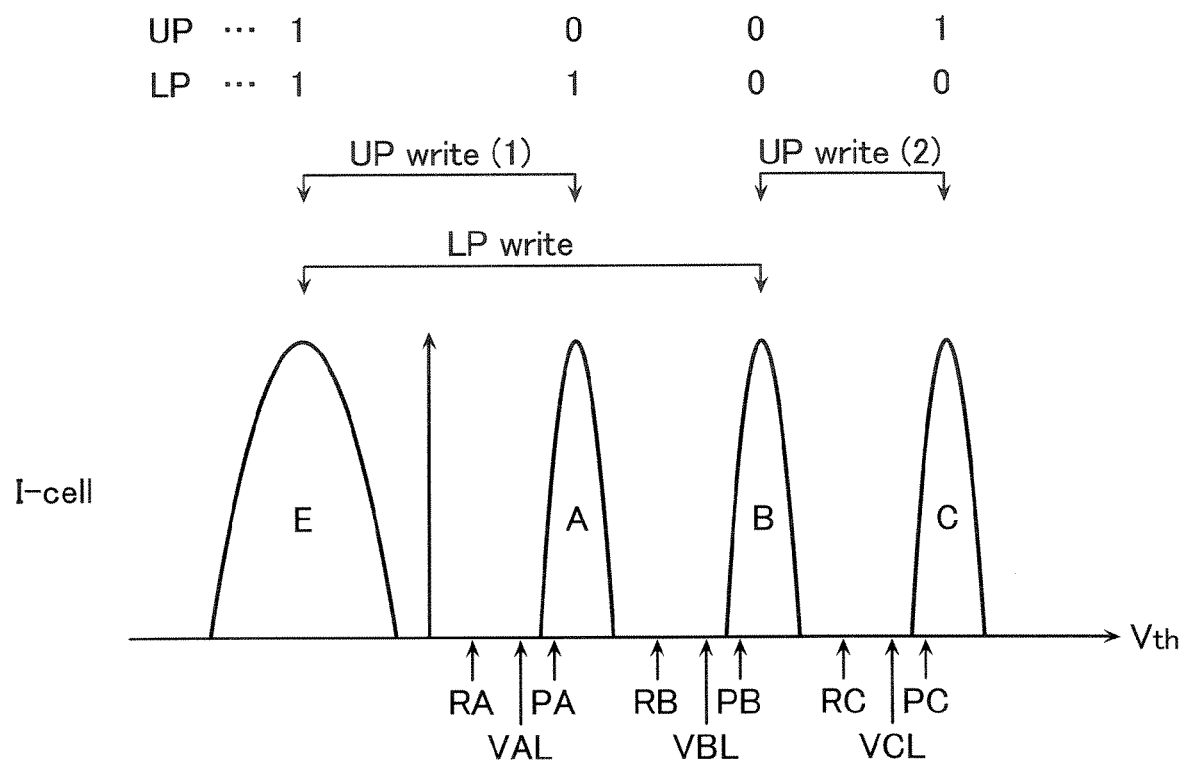
FIG. 25 shows a verify voltage setting example in another embodiment, in which the bit line voltage is controlled.

As shown in FIG. 25, with respect to write for data state A (or B, C), verify-read is performed with verify voltage VAL (or VBL, VCL) set to be lower than the final verify voltage PA (or PB, PC), and after reaching the threshold level, the medium voltage is applied to the selected bit line in the following write cycles. With this method, while the word line is kept constant, the rate of threshold level change may be controlled with the bit line voltage. Therefore, it becomes possible to make the cell threshold distribution small.

Figure 26:
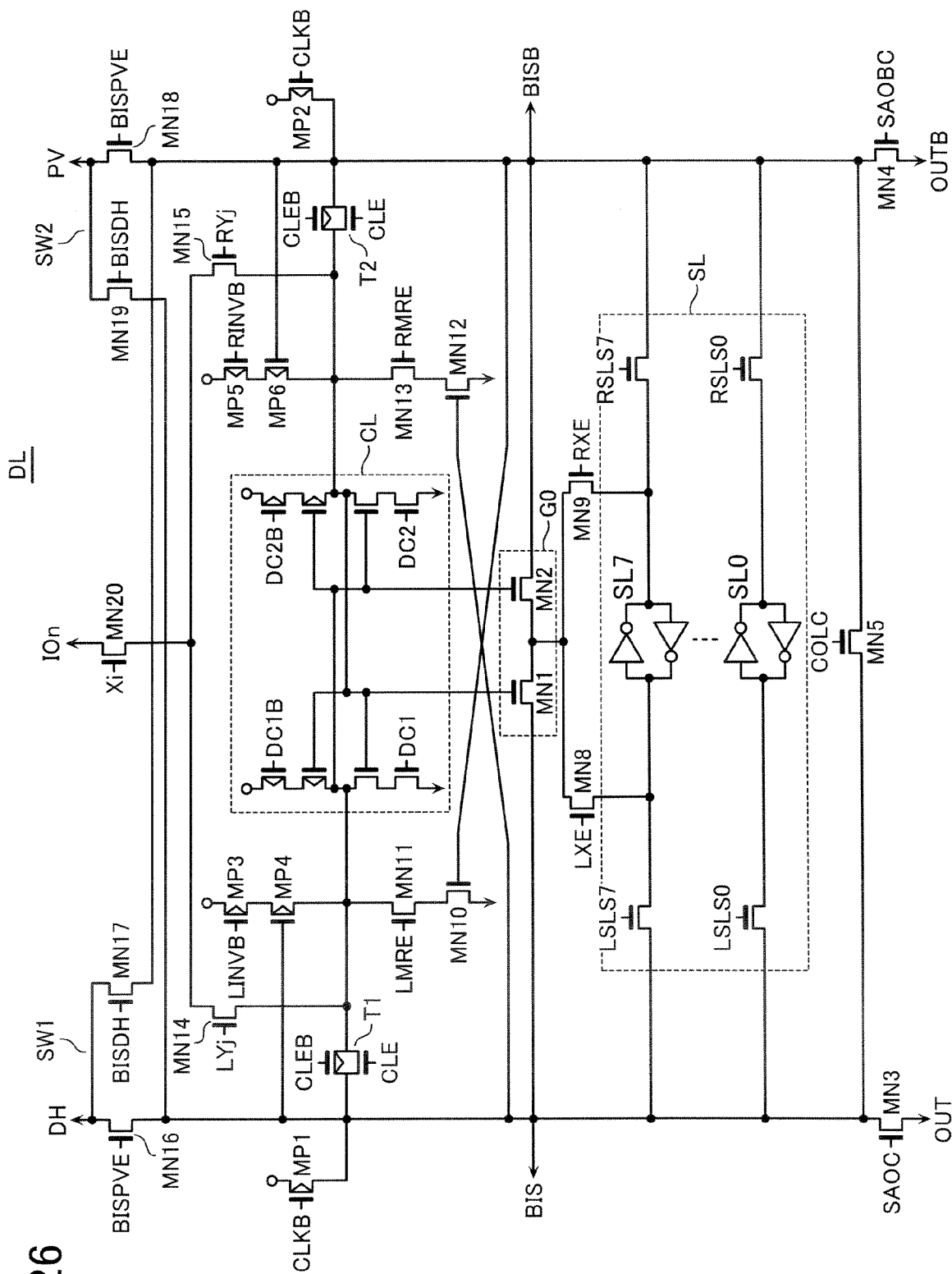
FIG. 26 shows the configuration of data transfer control circuit DL in the embodiment.

To adapt this write method, data transfer control circuit DL will be changed from that shown in FIG. 18 to that in FIG. 26. That is, in place of latch circuit TL, eight latch circuits SL (SL0-SL7) are disposed in parallel like the write-use latches VL (or VLB) disposed for one sense amplifier S/A.

These latch circuits SL are used for storing information designating that the bit lines are to be applied with the medium voltage or not. Note here that latch circuit SL7 therein serves as latch circuit TL in the above-described embodiment.

Figure 27:
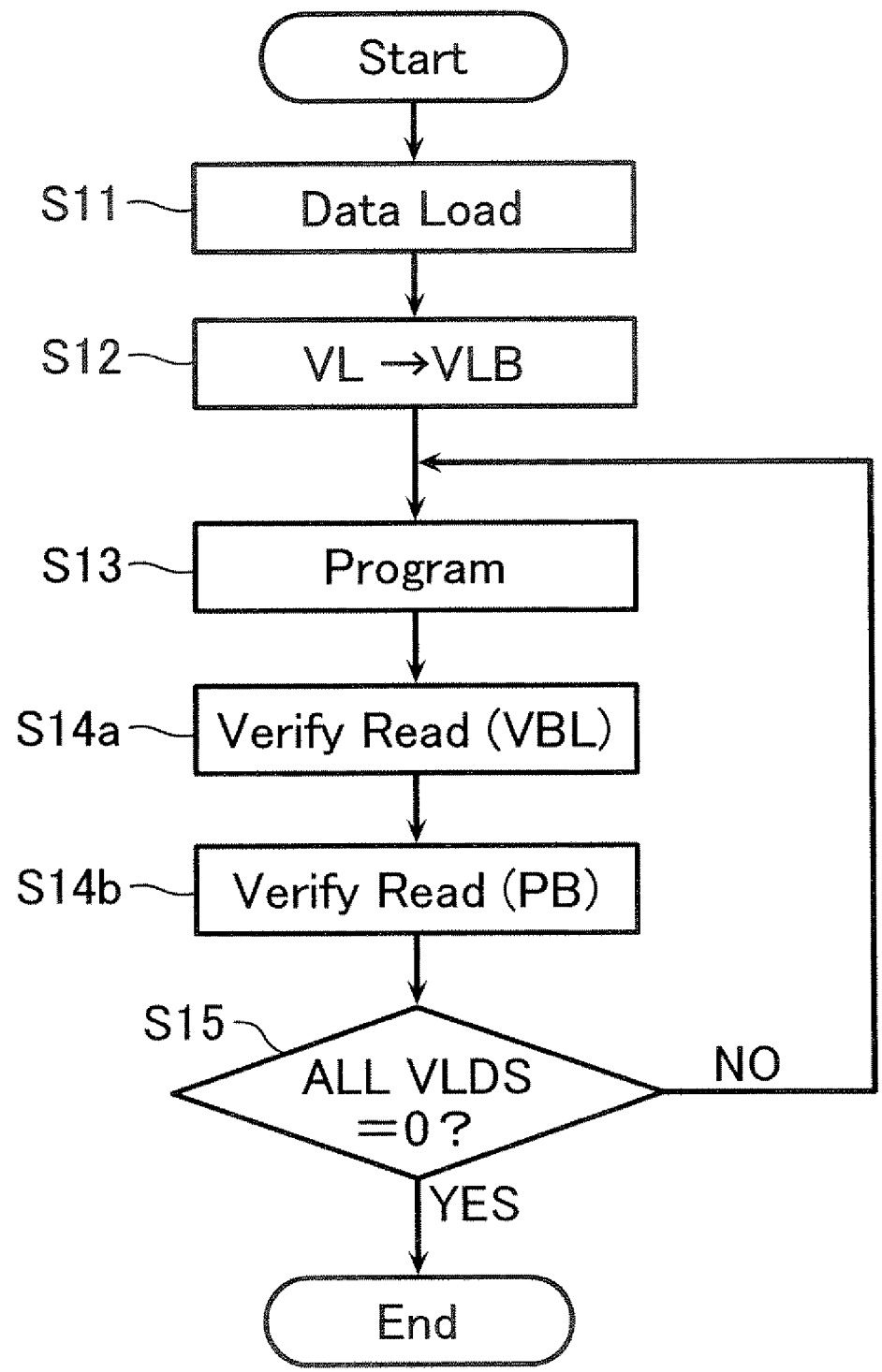
FIG. 27 shows the lower page write sequence in the embodiment.

FIG. 27 shows the lower page write flow in this embodiment in comparison with that shown in FIG. 19. As different from that shown in FIG. 19, verify step S14a with verify voltage VBL lower than the final one PB and verify step S14b with verify voltage PB are sequentially performed. Based on these verify results, it is decided whether the medium voltage is used at the next write step or not.

Figures 28, 29:
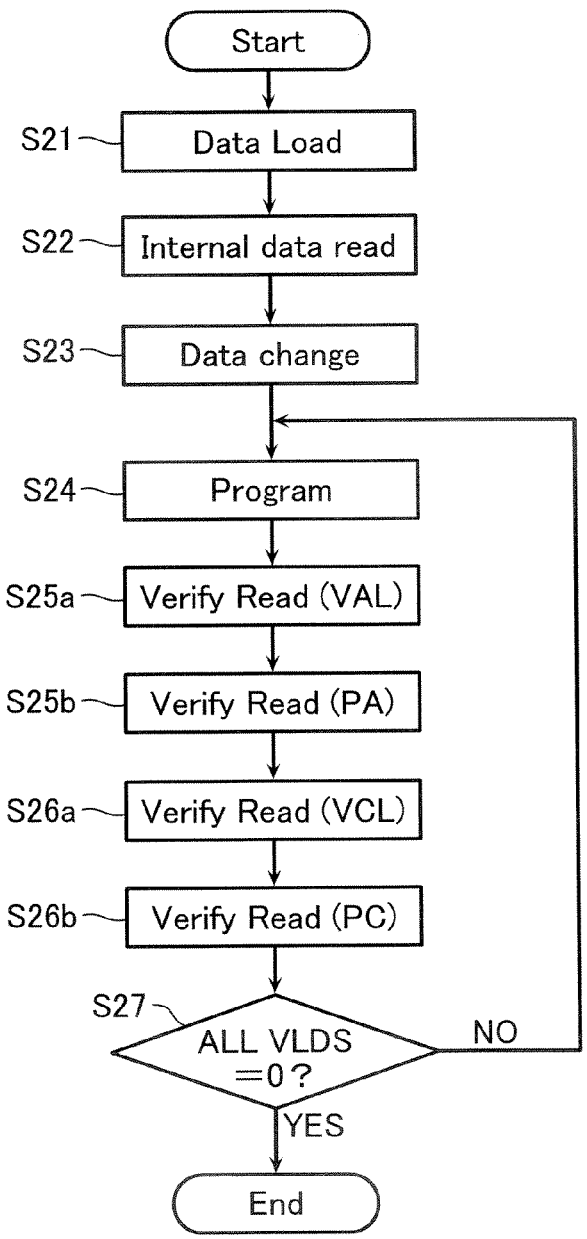
FIG. 28 shows the upper page write sequence in the embodiment.
FIG. 29 shows the relationship between the cell threshold level and data in data latches in the embodiment.

FIG. 28 shows the upper page write flow in this embodiment in comparison with that shown in FIG. 20. As different from that shown in FIG. 20, verify step S25a with verify voltage VAL lower than the final one PA and verify step S25b with verify voltage PA are sequentially performed; and verify step S26a with verify voltage VCL lower than the final one PC and verify step S26b with verify voltage PC are sequentially performed.

The lower page write with the medium voltage applied to the bit line will be explained in detail below. Supposing that information cells on the bit line BL side are selected, externally input write data are inverted and loaded in data latches VL (step S11), then the same data also are transferred to data latches VLB (step S12). Further, at this time, the externally input data are inverted and loaded in data latches SL.

Thereafter, data write is performed as similar to that in the above-described embodiment (step S13). After writing, verify-read is performed with verify voltage VBL, which is lower than the final one (step S14a). At this time, data in data latches SL and VLB are transferred to nodes DH and PV, respectively. As a result, only when VLB=PV="1", bit line precharge is performed, and verify-read is performed.

If the threshold level of an information cell is higher than VBL, the sensed output becomes OUT="L". This sensed result is stored in data latch SL. In case VLB=PV="0" or SL=DH="0", the sensed output is forcedly set at OUT="L". This also is stored in data latch SL. The above-described verify read is repeatedly performed for bit lines sequentially selected.

Next, verify-read is performed with the final verify voltage PB (step S14b). At this time, data in data latches VL and VLB are transferred to nodes DH and PV, respectively, and the same verify-read is performed as the former step. The sensed result is stored in data latch VL. The above-described verify read is repeatedly performed for bit lines sequentially selected.

Based on the results of the two verify-read steps, bit line voltage will be controlled in the following cycle. Bit line voltage control is basically performed in such a way a bit line is set at Vss ("0" write) or Vdd ("1" write, i.e., "0" write-inhibited) in response to data in data latch VL with control signal DT="H".

To apply the medium voltage to a bit line in accordance with the written state in this embodiment, twice bit line voltage controls are performed with level changing of the control signal DT (or DTB) applied to the transfer transistor Q23. This will be explained in detail with reference to FIG. 29.

FIG. 29 shows the relationship between cell threshold level and data in data latches VL, SL with respect to twice bit line controls (1) and (2). As a result of the above-described twice verify-read operations, the relationship between cell threshold level and data of latches VL and SL are shown in the field of the bit line control (1).

That is, if the threshold level of the information cell is lower than the verify level VBL, all "1" is set in data latches SL and VL as a result of the twice verify-reads. If the threshold level of the information cell is higher than the verify level VBL and lower than the final verify voltage PB, "0" and "1" are set in data latches SL and VL, respectively, as a result of the twice verify-reads. If the threshold level of the information cell is higher than the verify level PB, all "0" is set in data latches SL and VL as a result of the twice verify-reads.

Under the first bit line voltage control (1), data in data latch VL serves as bit line voltage with DT=Vdd+Vth. In detail, in case the cell threshold level Vth is lower that PB, the bit line is set at Vss (write state), while in case of Vth>PB, the bit line is set as Vdd (write-inhibit state).

After this bit line voltage control (1), the following bit line voltage control (2) is performed with DT=Vdd/2+Vth. Under this condition, as shown in FIG. 29, in case the cell threshold level is VBL<Vth<PB, data in data latch VL is inverted to be "0". As a result, under the bit line voltage control (2), the bit line voltage is set at Vdd/2, that serves a weak "0" write condition, for a cell with the threshold voltage Vth of: VBL<Vth<PB.

After the twice bit line voltage controls (1) and (2), write voltage is normally applied (step S13). The same write operations will be repeated until all cells to be written into level B are written into it.

The same bit line voltage control as described above may be performed in the upper page write mode.

Although in the above-described embodiment, one sense amplifier is prepared for eight bit line pairs, the present invention is not limited to this case. It is effective in general such a case that one sense amplifier is prepared for three or more bit line pairs.

[Application Devices]

As an embodiment, an electric card using the non-volatile semiconductor memory devices according to the above-described embodiments of the present invention and an electric device using the card will be described bellow.

Figure 30:
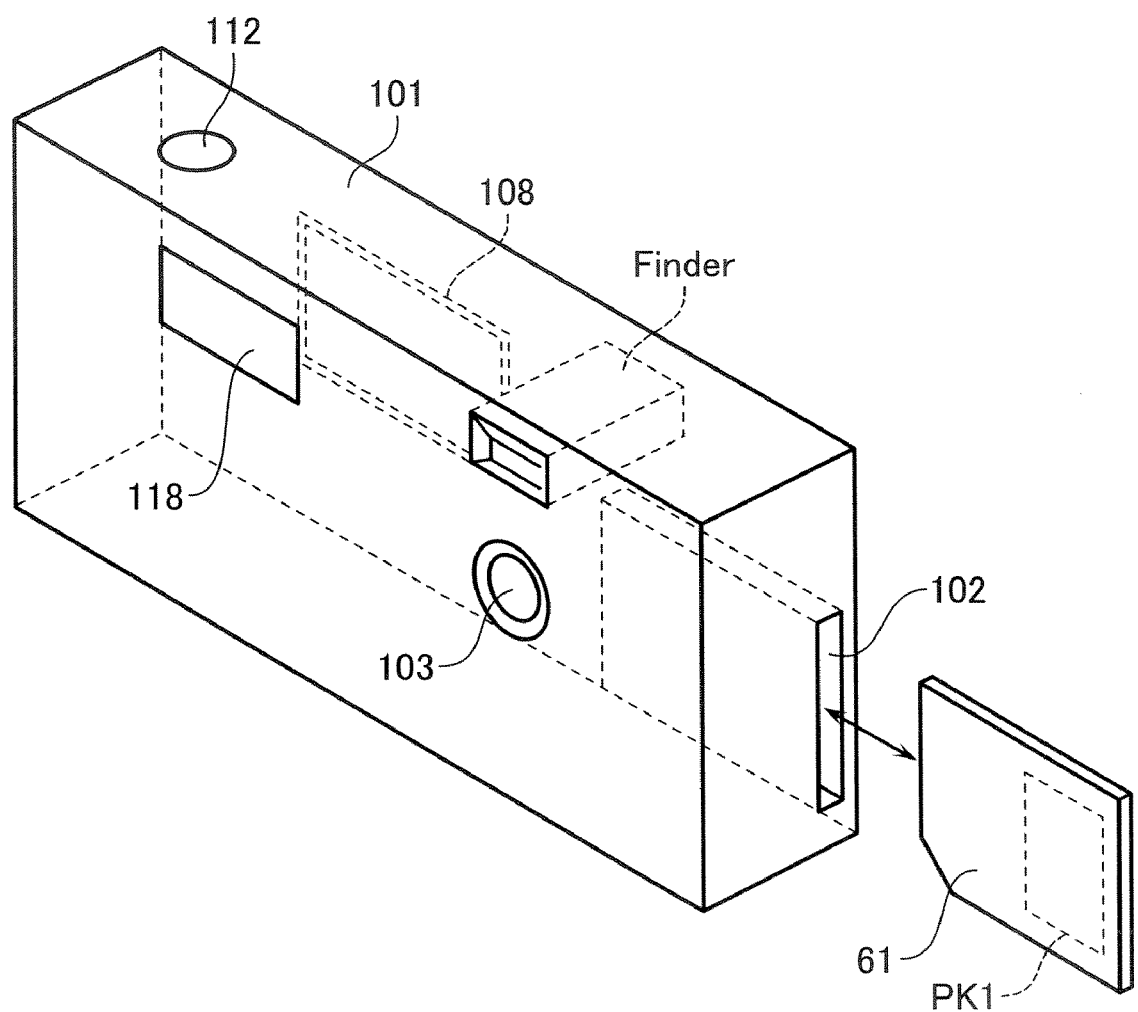
FIG. 30 shows another embodiment applied to a digital still camera.

FIG. 30 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 31:
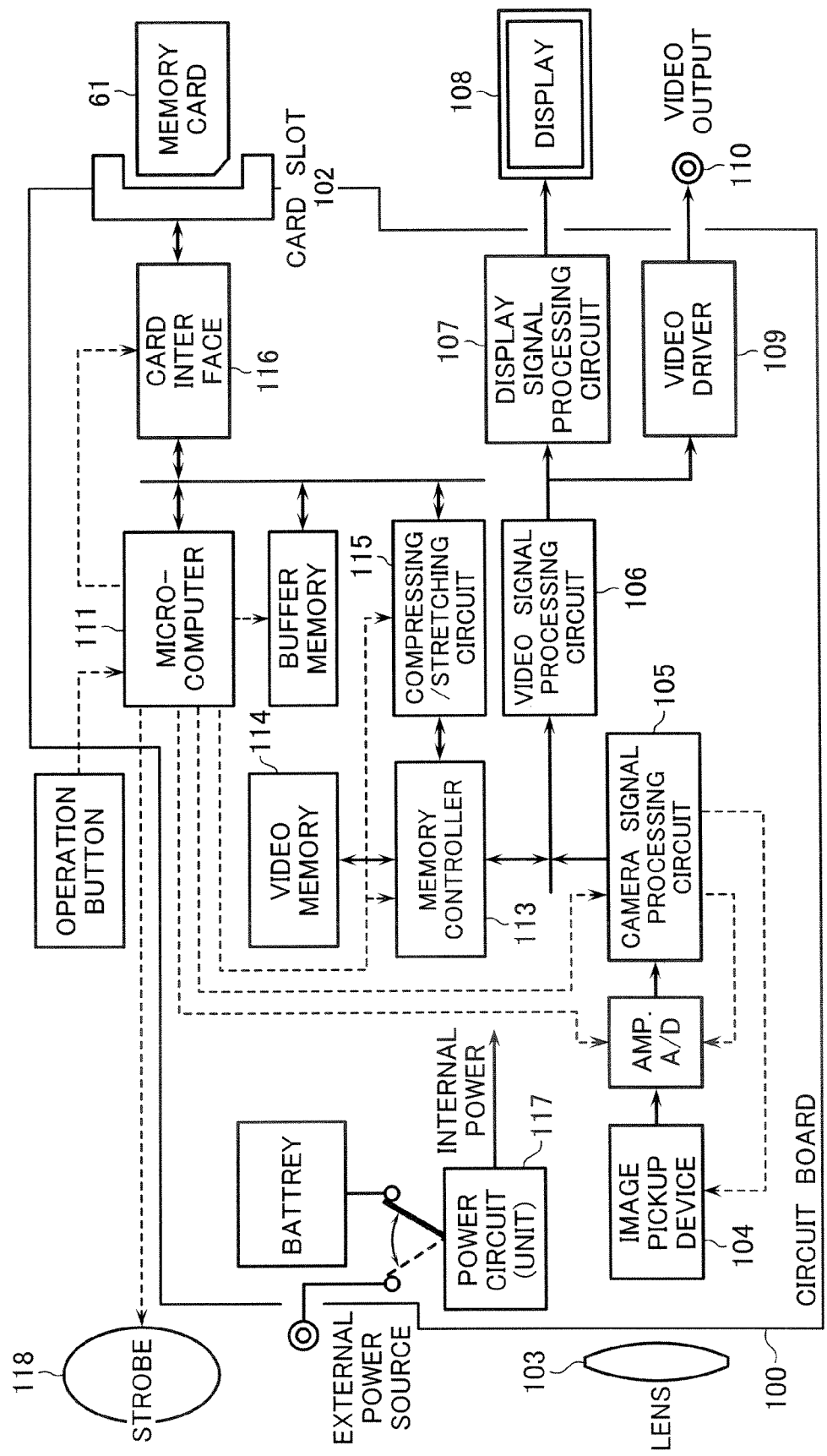
FIG. 31 shows the internal configuration of the digital still camera.

FIG. 31 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

Figure 32A:
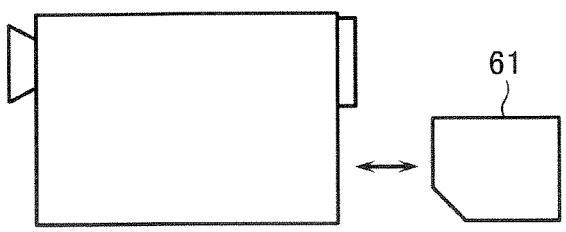
FIGS. 32A to 32J show other electric devices to which the embodiment is applied.
Figure 32F:
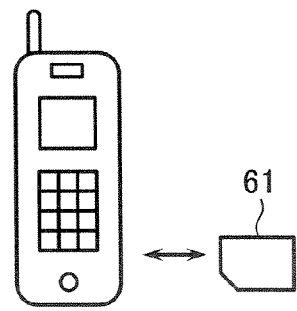
Figure 32B:
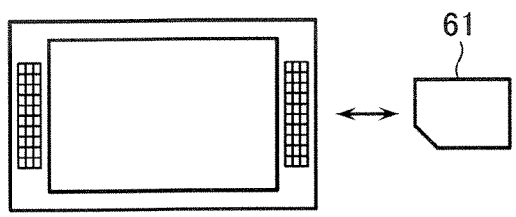
Figure 32G:
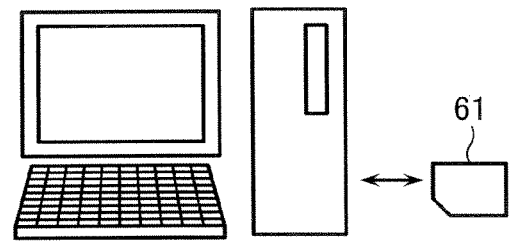
Figure 32C:
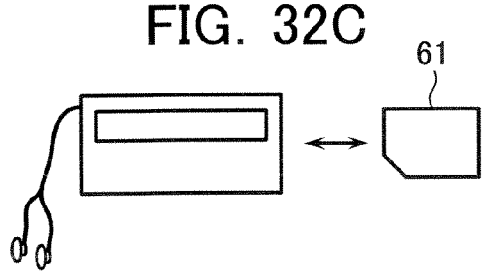
Figure 32H:
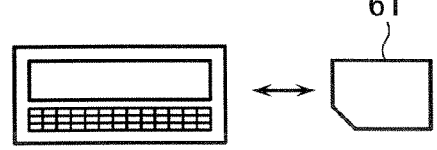
Figure 32D:
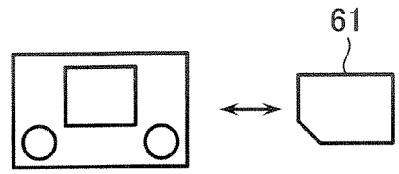
Figure 32I:
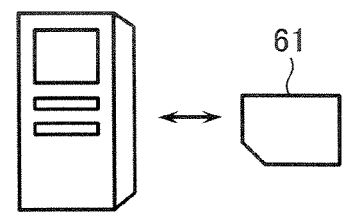
Figure 32E:
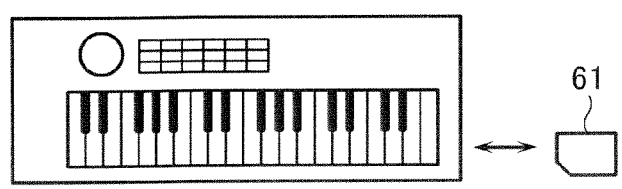
Figure 32J:
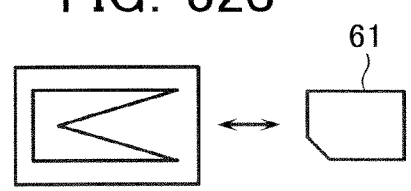

As described above, the electric card according to this embodiment can be used in portable electric devices such as the digital still camera explained above. However, the electric card can also be used in various apparatus such as shown in FIGS. 19A to 19J, as well as in portable electric devices. That is, the electric card can also be used in a video camera shown in FIG. 32A, a television set shown in FIG. 32B, an audio apparatus shown in FIG. 32C, a game apparatus shown in FIG. 32D, an electric musical instrument shown in FIG. 32E, a cell phone shown in FIG. 32F, a personal computer shown in FIG. 32G, a personal digital assistant (PDA) shown in FIG. 32H, a voice recorder shown in FIG. 32I, and a PC card shown in FIG. 32J.

This invention is not limited to the above-described embodiments. It will be understood by those skilled in the art that various changes in form and detail may be made without departing from the spirit, scope, and teaching of the invention.

What is claimed is:

1. A semiconductor memory device comprising:
   first and second cell arrays each having electrically rewritable and non-volatile memory cells arranged, memory cells in the main parts of the first and second cell arrays serving as information cells used for storing data, the remaining parts thereof serving as reference cells used for driving a reference current used for sensing data of the information cells;

three or more bit line pairs disposed in the first and second cell arrays, each pair being constituted by first and second bit lines disposed in the first and second cell arrays, respectively;

a sense amplifier so shared by the bit line pairs as to sequentially detect cell current differences between the information cells and the reference cells coupled to the bit line pairs; and first and second data latches arranged to store write data to be written into the first and second cell arrays, each number of the first and second data latches being equal to that of the bit line pairs, which share the sense amplifier and are simultaneously selected.

2. The semiconductor memory device according to claim 1, further comprising:

first and second data transfer nodes disposed in correspondence with first and second output nodes of the sense amplifier, respectively;

first and second transferring transistors disposed for selectively coupling one data nodes of the first and second data latches to the first and second output nodes of the sense amplifier via the first and second data transfer nodes, respectively; and third and fourth transferring transistors disposed for selectively coupling the other data nodes of the first and second data latches to the bit lines in the first and second cell arrays, respectively.

3. The semiconductor memory device according to claim 2, further comprising:

a data transfer control circuit disposed for controlling data transfer between the first, second output nodes of the sense amplifier and the first, second data transfer nodes, and between the first, second data transfer nodes and a data line.

4. The semiconductor memory device according to claim 1, wherein the first and second data latches serve as caches in a data read mode.

5. The semiconductor memory device according to claim 1, wherein in a data write mode, one of the first and second data latches store write data used for controlling bit line voltage, the write data being rewritten in accordance with the verify-read result at each write cycle, and the other store the write data as it is until the data write mode ends.

6. The semiconductor memory device according to claim 1, further comprising:

first and second verify-judgment circuits attached to the first and second data latches, respectively, for judging write completion based on the write data, which are rewritten in accordance with the verify-read result.

7. The semiconductor memory device according to claim 1, further comprising;

bit line precharge circuits coupled to first and second input nodes of the sense amplifier, respectively, for precharging the bit line pairs at a data read time; and verify-control circuits coupled to the first and second input nodes of the sense amplifier, respectively, to be controlled by write data stored in one of the first and second data latches, thereby forcedly setting the output level of the sense amplifier.

8. The semiconductor memory device according to claim 1, wherein the first and second cell arrays each having a plurality of information cell blocks with the information cells arranged and at least one reference cell block with the reference cells arranged, the information cell being to store one of two or more data levels, the reference cell being to store a reference level used for sensing data in the information cell, and wherein the information cell blocks and the reference cell block each includes NAND cell units arranged therein, each of which has a plurality of the memory cells connected in series.

9. The semiconductor memory device according to claim 3, wherein the information cells in the first and second cell arrays store binary data, and wherein in a data write mode, write data are loaded in one of the first and second data latches, and then inverted via the data transfer control circuit to be transferred to the other.

10. The semiconductor memory device according to claim 3, wherein the information cells in the first and second cell arrays store four-level data, and wherein the data transfer control circuit comprises:

a first latch circuit configured to store write data;

an XOR gate configured to execute an exclusive OR logic operation between the output data of the sense amplifier and the stored data in the first latch circuit; and a second latch circuit configured to store the output of the XOR gate.

11. A semiconductor memory device comprising:

first and second cell arrays each having electrically rewritable and non-volatile memory cells arranged, memory cells in the main parts of the first and second cell arrays serving as information cells used for storing data, the remaining parts thereof serving as reference cells used for driving a reference current used for sensing data of the information cells;

three or more bit line pairs disposed in the first and second cell arrays, each pair being constituted by first and second bit lines disposed in the first and second cell arrays, respectively;

a sense amplifier so shared by the bit line pairs as to sequentially detect cell current differences between the information cells and the reference cells coupled to the bit line pairs;

first and second data latches arranged to store write data to be written into the first and second cell arrays, each number of the first and second data latches being equal to that of the bit line pairs, which share the sense amplifier and are simultaneously selected; and first and second data transfer nodes disposed in correspondence with first and second output nodes of the sense amplifier, respectively, wherein in a data read mode, cell current differences generated between the bit line pairs simultaneously selected in the first and second cell arrays are sequentially transferred to and detected by the sense amplifier, the sensed output of which are sequentially transferred to one of the first and second data latches serving as data caches via one of the first and second data transfer node, and in a data write mode, write data loaded in one of the first and second data latches are used for controlling bit line voltage for simultaneously selected bit lines in one of the first and second cell arrays.

12. The semiconductor memory device according to claim 11, wherein while read data cached in one of the first and second data latches are output to the external, read data in the following cycle are cached in the other of the first and second data latches.

13. The semiconductor memory device according to claim 11, further comprising:

first and second transferring transistors disposed for selectively coupling one data nodes of the first and second data latches to the first and second output nodes of the sense amplifier via the first and second data transfer nodes, respectively; and third and fourth transferring transistors disposed for selectively coupling the other data nodes of the first and second data latches to the bit lines in the first and second cell arrays, respectively.

14. The semiconductor memory device according to claim 13, further comprising:

a data transfer control circuit disposed for controlling data transfer between the first, second output nodes of the sense amplifier and the first, second data transfer nodes, and between the first, second data transfer nodes and a data line.

15. The semiconductor memory device according to claim 11, wherein in the data write mode, write data are loaded in both of the first and second data latches, the write data in one of the first and second data latches being rewritten in accordance with the verify-read result at each write cycle, the write data in the other being stored as it is until the data write mode ends.

16. The semiconductor memory device according to claim 14, further comprising:

first and second verify-judgment circuits attached to the first and second data latches, respectively, for judging write completion based on the write data, which are rewritten in accordance with the verify-read result.

17. The semiconductor memory device according to claim 11, further comprising;

bit line precharge circuits coupled to first and second input nodes of the sense amplifier, respectively, for precharging the bit line pairs at the data read time; and verify-control circuits coupled to the first and second input nodes of the sense amplifier, respectively, to be controlled by write data stored in one of the first and second data latches, thereby forcedly setting the output level of the sense amplifier at a verify-read time.

18. The semiconductor memory device according to claim 11, wherein the first and second cell arrays each having a plurality of information cell blocks with the information cells arranged and at least one reference cell block with the reference cells arranged, the information cell being to store one of two or more data levels, the reference cell being to store a reference level used for sensing data in the information cell, and wherein the information cell blocks and the reference cell block each includes NAND cell units arranged therein, each of which has a plurality of the memory cells connected in series.

19. The semiconductor memory device according to claim 14, wherein the information cells in the first and second cell arrays store four-level data, and wherein the data transfer control circuit comprises:

a first latch circuit configured to store write data;

an XOR gate configured to execute an exclusive OR logic operation between the output data of the sense amplifier and the stored data in the first latch circuit; and a second latch circuit configured to store the output of the XOR gate.

20. The semiconductor memory device according to claim 16, wherein the information cells in the first and second cell arrays store four-level data, and wherein the first and second verify-judgment circuits each configured to do verify-judgment for each column or for each data level, and wherein the data transfer control circuit comprises:

a first latch circuit configured to store write data;

an XOR gate configured to execute an exclusive OR logic operation between the output data of the sense amplifier and the stored data in the first latch circuit; and multiple second latch circuits disposed in parallel to sequentially store the output of the XOR gate.

* * * * *